(12) United States Patent
Ishino et al.

(10) Patent No.: US 12,719,437 B2
(45) Date of Patent: Aug. 25, 2026

(54) PIEZOELECTRIC RESONATOR DEVICE

(71) Applicant: DAISHINKU CORPORATION, Kakogawa (JP)

(72) Inventors: Satoru Ishino, Kakogawa (JP); Hiroaki Yamashita, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 701 days.

(21) Appl. No.: 18/265,690

(22) PCT Filed: Dec. 13, 2021

(86) PCT No.: PCT/JP2021/045839
§ 371 (c)(1),
(2) Date: Jun. 7, 2023

(87) PCT Pub. No.: WO2022/131213
PCT Pub. Date: Jun. 23, 2022

(65) Prior Publication Data

US 2024/0039505 A1 Feb. 1, 2024

(30) Foreign Application Priority Data

Dec. 16, 2020 (JP) ................................ 2020-208448

(51) Int. Cl.

| | |
|---|---|
| ***H03H 9/02*** | (2006.01) |
| ***H03H 9/10*** | (2006.01) |
| ***H03H 9/19*** | (2006.01) |

(52) U.S. Cl.
CPC ...... *H03H 9/02086* (2013.01); *H03H 9/1035* (2013.01); *H03H 9/19* (2013.01)

(58) Field of Classification Search
CPC ...... H03H 9/0595; H03H 9/1035; H03H 9/19; H03H 9/02086; H03H 9/105
See application file for complete search history.

(56) References Cited

U.S. PATENT DOCUMENTS

| | | | | |
|---|---|---|---|---|
| 8,610,337 B2 * | 12/2013 | Kawahara ............ | H03H 9/1035 310/365 |
| 2012/0217846 A1 * | 8/2012 | Takahashi ............ | H03H 9/0595 310/346 |
| 2012/0313488 A1 * | 12/2012 | Harada .................. | H03H 9/105 310/346 |
| 2014/0042874 A1 * | 2/2014 | Takahashi .............. | H10N 30/40 310/351 |
| 2020/0044623 A1 * | 2/2020 | Kojo .................. | H03H 9/02125 |
| 2021/0399715 A1 | 12/2021 | Ishino et al. | |

FOREIGN PATENT DOCUMENTS

| | | |
|---|---|---|
| JP | 2010-252051 A | 11/2010 |
| JP | 2020-088589 A | 6/2020 |
| JP | 2020-162069 A | 10/2020 |

* cited by examiner

*Primary Examiner* — J. San Martin
(74) *Attorney, Agent, or Firm* — METROLEX IP LAW GROUP, PLLC; Robert L. Scott, Esq.

(57) ABSTRACT

A piezoelectric resonator device according to one or more embodiments may be provided, in which a crystal resonator plate includes a cutout part between a vibrating part and an external frame part, and a metal film formed on a first main surface of a first sealing member is electrically connected to an external electrode terminal formed on a second main surface, which does not face an internal space, of a second sealing member via a first internal wiring formed on an inner wall surface of the external frame part.

9 Claims, 19 Drawing Sheets

PIEZOELECTRIC RESONATOR DEVICE

TECHNICAL FIELD

The present invention relates to piezoelectric resonator devices such as a piezoelectric resonator.

BACKGROUND ART

Recently, in various electronic devices, the operating frequencies have increased and the package sizes (especially, the heights) have decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2010-252051 A

SUMMARY OF THE INVENTION

Problem to be Solved by the Invention

As an example of a countermeasure against electromagnetic susceptibility (EMS) for the above-described piezoelectric resonator device, an electrode for ground connection is formed on an upper surface of a package so that the electrode for ground connection is connected to an external electrode terminal formed on a bottom surface of the package via a side-surface wiring formed on a side surface of the package. However, when the side-surface wiring for ground connection is formed on the piezoelectric resonator plate, there may be problems as described below.

That is, the side-surface wiring may be damaged or corroded because of influence of the external environment, which may prevent stable ground connection. Also in the wafer of the piezoelectric resonator plate, since the electrode composition of the side-surface wiring for ground connection is common with the electrode composition of the excitation electrode on the vibrating part, the side-surface wiring sometimes has a thin base electrode film (for example, a Ti film) compared to the electrode composition of the first and second sealing members. Thus, when mounting the package by soldering, the solder often erodes the side-surface wiring, which may cause disconnection of wiring by solder erosion.

The present invention was made in consideration of the above circumstances, an object of which is to provide a piezoelectric resonator device having a sandwich structure, which is capable of realizing stable ground connection.

Means for Solving the Problem

In order to solve the above problem, a piezoelectric resonator device of the present invention includes: a piezoelectric resonator plate including a first excitation electrode that is formed on a first main surface of a substrate, and a second excitation electrode that is formed on a second main surface of the substrate and that makes a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and furthermore bonding the second sealing member to the piezoelectric resonator plate. The internal space hermetically seals a vibrating part including the first excitation electrode and the second excitation electrode of the piezoelectric resonator plate. The piezoelectric resonator plate includes: the vibrating part; an external frame part surrounding an outer periphery of the vibrating part; a support part connecting the vibrating part and the external frame part; and a cutout part formed by cutting out the piezoelectric resonator plate between the vibrating part and the external frame part. A grounding electrode formed on a main surface of the first sealing member is electrically connected to an external electrode terminal formed on a main surface, which does not face the internal space, of the second sealing member via an internal wiring formed on an inner wall surface of the external frame part of the piezoelectric resonator plate.

With the above-described configuration, since the internal wiring for ground connection is provided on the inner wall surface of the external frame part of the piezoelectric resonator plate, it is possible to prevent the influence of the external environment, which leads to stable ground connection. Also, since the internal wiring for ground connection is provided on the inner wall surface of the external frame part of the piezoelectric resonator plate, it is possible to prevent the disconnection due to solder erosion when mounting the package of the piezoelectric resonator device by soldering, and thus to perform stable ground connection via the internal wiring.

In the above-described configuration, it is preferable that a sealing part having an annular shape and sealing hermetically the vibrating part of the piezoelectric resonator plate is each formed between the first sealing member and the piezoelectric resonator plate and between the second sealing member and the piezoelectric resonator plate, and that the sealing part is electrically connected to the internal wiring. With this configuration, the vibrating part of the piezoelectric resonator plate is surrounded by the earth-connected annular sealing part, which contributes to improvement of electromagnetic shielding effect.

In the above-described configuration, it is preferable that the internal wiring is formed so as to extend along the inner wall surface of the external frame part. With this configuration, it is possible to improve the electromagnetic shielding effect by the internal wiring formed so as to have a planar shape on the inner wall surface of the external frame part.

In the above-described configuration, it is preferable that the internal wiring is each provided on a pair of inner wall surfaces of the external frame part, which face each other in plan view. With this configuration, it is possible to effectively shield electromagnetic waves from the lateral sides of the vibrating part since the vibrating part is interposed between the pair of internal wirings each having a planar shape.

In the above-described configuration, it is preferable that the width of the internal wiring is larger than the respective widths of the first excitation electrode and the second excitation electrode in a direction in which the internal wiring extends. With this configuration, it is possible to further improve the electromagnetic shielding effect.

In the above-described configuration, it is preferable that the grounding electrode is formed on the main surface of the first sealing member, which does not face the internal space, and that the grounding electrode is electrically connected to an external wiring formed on an outer side surface of the first sealing member. It is also preferable that the external electrode terminal of the second sealing member is electrically connected to an external wiring formed on an outer side surface of the second sealing member. With this configuration, it is not necessary to provide any through holes for electrical connection in the first sealing member and the second sealing member. Thus, this configuration can be easily adapted to the size reduction of the piezoelectric resonator device. Furthermore, the grounding electrode is provided on the main surface of the first sealing member, which does not face the internal space. Thus, it is possible to avoid preventing the wirings from being formed in the internal space, which also prevents short-circuits with the first excitation electrode, the second excitation electrode, and the like. In addition, since the grounding electrode is formed on the surface of the package that keeps a relative distance from the first excitation electrode and the second excitation electrode, it is possible to further improve the electromagnetic shielding effect.

In the above-described configuration, it is preferable that an external wiring is formed on an outer side surface of the piezoelectric resonator plate so as to be electrically connected to one excitation electrode out of the first excitation electrode and the second excitation electrode, and that the internal wiring is disposed between the external wiring and the one excitation electrode. With this configuration, stray capacity may be generated because the external wiring and the excitation electrode (first/second excitation electrode) are superimposed on each other in side view. However, it is possible to reduce the stray capacity derived from the superimposed external wiring and the excitation electrode by disposing the earth-connected internal wiring between the external wiring and the excitation electrode.

In the above-described configuration, it is preferable that the grounding electrode is formed on the main surface of the first sealing member, which faces the internal space, and that the grounding electrode is electrically connected to the internal wiring formed on the inner wall surface of the external frame part of the piezoelectric resonator plate. With this configuration, the grounding electrode is provided on the main surface of the first sealing member which faces the internal space while the internal wiring for ground connection is provided on the inner wall surface of the external frame part of the piezoelectric resonator plate. Thus, it is possible to prevent the influence of the external environment, which leads to stable ground connection.

In the above-described configuration, it is preferable that the piezoelectric resonator plate is an AT-cut crystal plate, and that the internal wiring is formed along a Z' axis direction of the AT-cut crystal plate. With this configuration, it is possible to prevent the disconnection of the internal wiring due to anisotropy of the AT-cut crystal plate when processing the piezoelectric resonator plate by wet etching.

Effects of the Invention

In the piezoelectric resonator device of the present invention, since the internal wiring for ground connection is provided on the inner wall surface of the external frame part of the piezoelectric resonator plate, it is possible to prevent the influence of the external environment, which leads to stable ground connection. Also, since the internal wiring for ground connection is provided on the inner wall surface of the external frame part of the piezoelectric resonator plate, it is possible to prevent the disconnection due to solder erosion when mounting the package of the piezoelectric resonator device by soldering, and thus to perform stable ground connection via the internal wiring.

MODE FOR CARRYING OUT THE INVENTION

Hereinafter, an embodiment of the present invention will be described in detail with reference to the drawings. In the following embodiment, a piezoelectric resonator device to which the present invention is applied is a crystal resonator.

Figure 1:
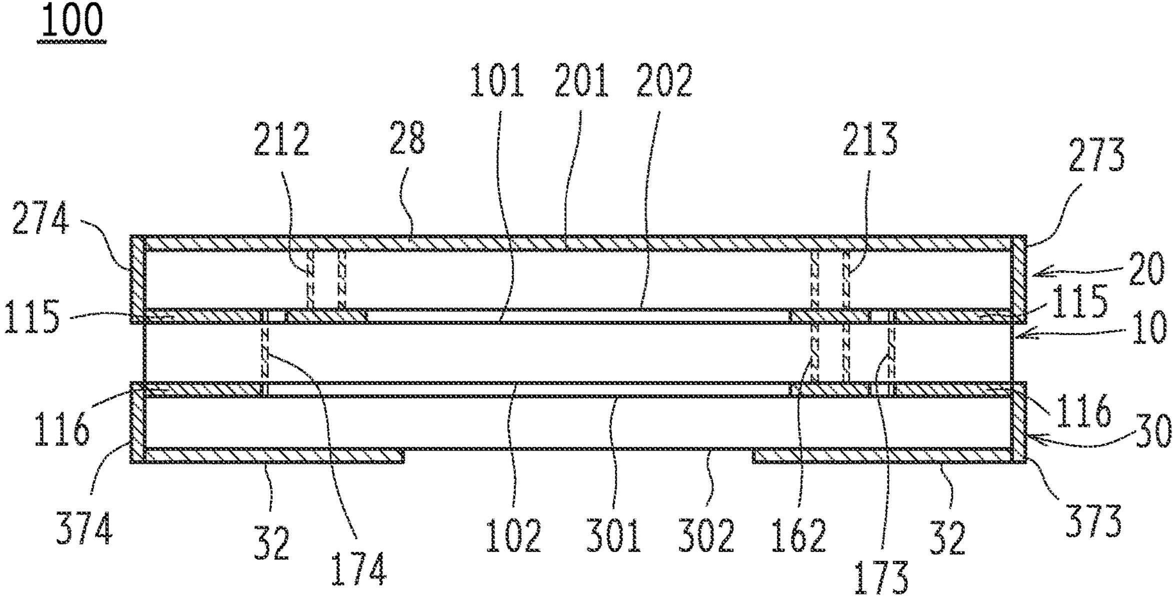
FIG. 1 is a schematic configuration diagram schematically illustrating a configuration of a crystal resonator according to an embodiment.

First, the basic configuration of a crystal resonator 100 according to this embodiment is described. As shown in FIG. 1, the crystal resonator 100 includes: a crystal resonator plate (piezoelectric resonator plate) 10; a first sealing member 20; and a second sealing member 30. In this crystal resonator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. That is, in the crystal resonator 100, the first sealing member 20 and the second sealing member 30 are bonded to respective main surfaces of the crystal resonator plate 10, thus an internal space (cavity) of the package is formed. In this internal space, a vibrating part 11 (see FIGS. 4 and 5) is hermetically sealed.

The crystal resonator 100 according to this embodiment has, for example, a package size of 1.0×0.8 mm, which is reduced in size and height. According to the size reduction, no castellation is formed in the package. Side-surface wirings and the like (described later) are used for conduction between electrodes. The crystal resonator 100 is electrically connected to an external circuit board (not shown) provided outside via solder.

Next, the respective components of the above-described crystal resonator 100 (i.e. the crystal resonator plate 10, the first sealing member 20 and the second sealing member 30) are described with reference to FIGS. 1 to 7. Here, each of the components is described as a single body without being bonded. FIGS. 2 to 7 merely show respective configuration examples of the crystal resonator plate 10, the first sealing member 20 and the second sealing member 30, and thus the present invention is not limited thereto.

Figure 4:
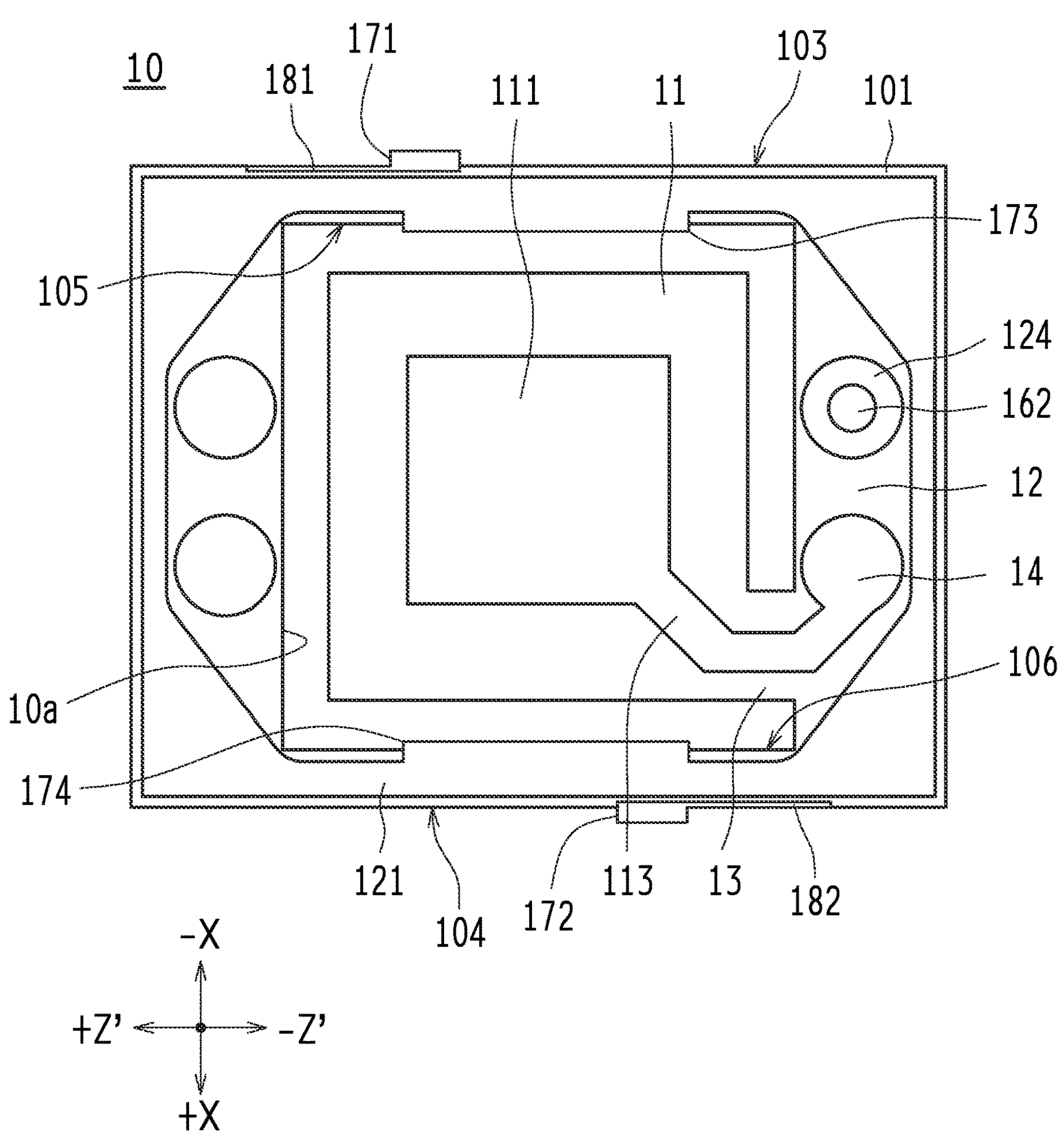
FIG. 4 is a schematic plan view illustrating a first main surface of a crystal resonator plate of the crystal resonator.
Figure 5:
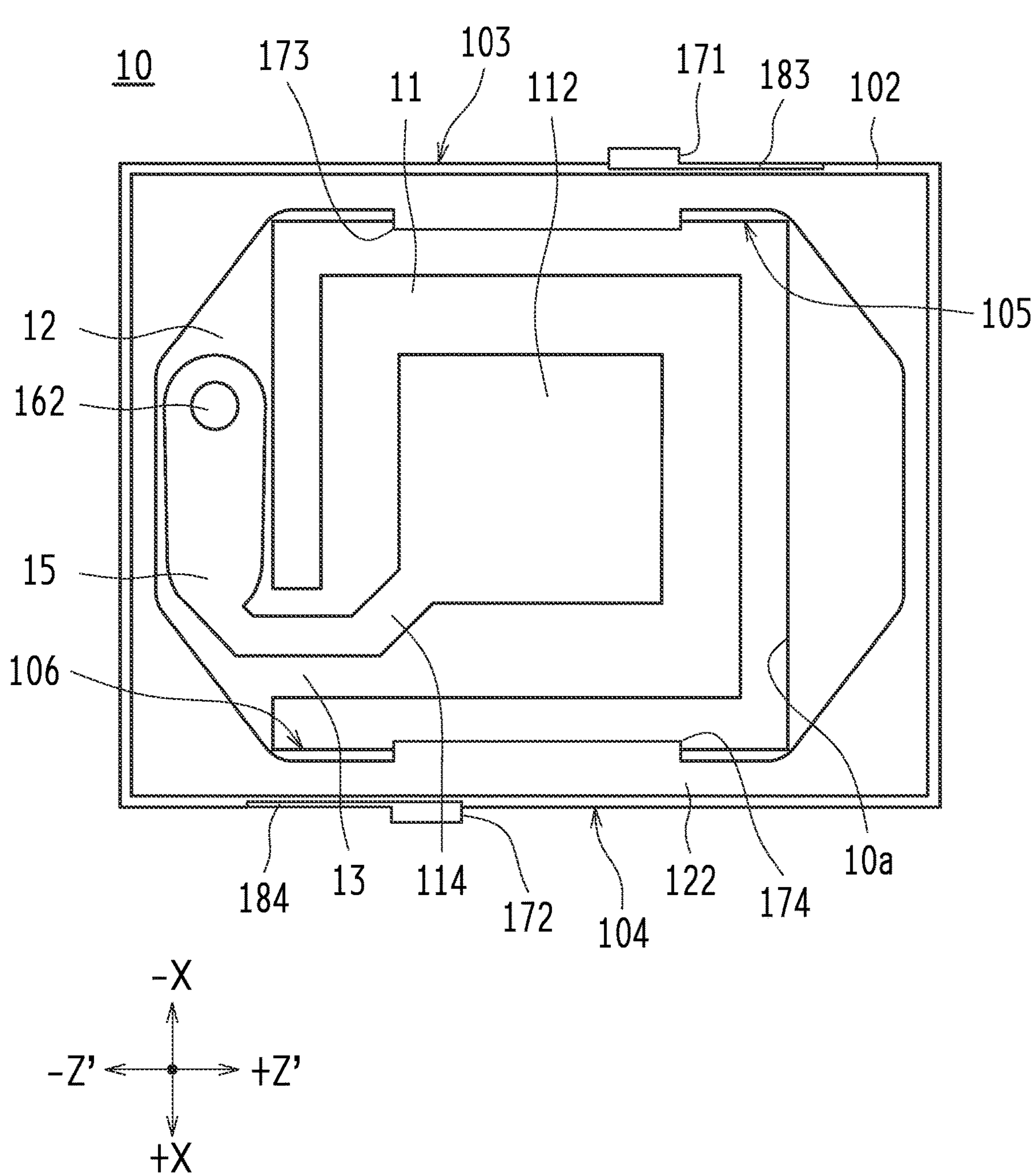
FIG. 5 is a schematic plan view illustrating a second main surface of the crystal resonator plate of the crystal resonator.

The crystal resonator plate 10 is a piezoelectric substrate made of crystal as shown in FIGS. 4 and 5. Each main surface (i.e. a first main surface 101 and a second main surface 102) is formed as a smooth flat surface (mirror-finished). In this embodiment, an AT-cut crystal plate that causes thickness shear vibration is used as the crystal resonator plate 10. In the crystal resonator plate 10 shown in FIGS. 4 and 5, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by approximately 35° 15' from the Y axis and the Z axis out of the crystal axes of the crystal (this cutting angle may be changed to a certain extent within the range in which the frequency temperature characteristics of the AT-cut crystal resonator plate can be adjusted). The Y' axis direction and the Z' axis direction correspond to the directions in which the AT-cut crystal is cut out.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction. Also, a cutout part 10_a_ is provided between the vibrating part 11 and the external frame part 12 by cutting out the crystal resonator plate 10. In this embodiment, the crystal resonator plate 10 has only one support part 13 to connect the vibrating part 11 to the external frame part 12. The cutout part 10_a_ is continuously formed so as to surround the outer periphery of the vibrating part 11.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to lead-out wirings (a first lead-out wiring 113 and a second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view. The outer peripheral edge of the resonator-plate-side first bonding pattern 121 is disposed so as to be adjacent to the outer peripheral edge of the first main surface 101 of the crystal resonator plate 10 (external frame part 12). The outer peripheral edge of the resonator-plate-side second bonding pattern 122 is disposed so as to be adjacent to the outer peripheral edge of the second main surface 102 of the crystal resonator plate 10 (external frame part 12).

On the first main surface 101 of the crystal resonator plate 10, interlayer wiring bonding patterns 181 and 182 are formed on the outer peripheral side of the resonator-plate-side first bonding pattern 121. The interlayer wiring bonding patterns 181 and 182 are not connected to the resonator-plate-side first bonding pattern 121, but are disposed at a predetermined distance from the resonator-plate-side first bonding pattern 121. The interlayer wiring bonding pattern 181 is provided on a part of the first main surface 101 of the crystal resonator plate 10 in the −X direction and in the +Z' direction, and connected to a first side-surface wiring 171 described later. The interlayer wiring bonding pattern 182 is provided on a part of the first main surface 101 of the crystal resonator plate 10 in the +X direction and in the −Z' direction, and connected to a second side-surface wiring 172 described later.

On the second main surface 102 of the crystal resonator plate 10, interlayer wiring bonding patterns 183 and 184 are formed on the outer peripheral side of the resonator-plate-side second bonding pattern 122. The interlayer wiring bonding patterns 183 and 184 are not connected to the resonator-plate-side second bonding pattern 122, but are disposed at a predetermined distance from the resonator-plate-side second bonding pattern 122. The interlayer wiring bonding pattern 183 is provided on a part of the second main surface 102 of the crystal resonator plate 10 in the −X direction and in the +Z' direction, and connected to the first side-surface wiring 171 described later. The interlayer wiring bonding pattern 184 is provided on a part of the second main surface 102 of the crystal resonator plate 10 in the +X direction and in the −Z' direction, and connected to the second side-surface wiring 172 described later.

As shown in FIGS. 4 and 5, a through hole is formed in the crystal resonator plate 10 so as to penetrate between the first main surface 101 and the second main surface 102. More specifically, a first through hole 162 is disposed in the external frame part 12, on the inner peripheral side of the resonator-plate-side first bonding pattern 121 and the resonator-plate-side second bonding pattern 122. Also, the first through hole 162 is disposed on one side in the Z' axis direction relative to the vibrating part 11 (in FIGS. 4 and 5, on the side of the −Z' direction). On the periphery of the first through hole 162, a connection bonding pattern 124 is formed on the first main surface 101 side while the connection bonding pattern 15 is formed on the second main surface 102 side.

In the first through hole 162, a through electrode is formed along an inner wall surface of the first through hole 162 so as to establish conduction between the electrodes formed on the first main surface 101 and the second main surface 102. The center part of the first through holes 162 is a hollow penetrating part penetrating between the first main surface 101 and the second main surface 102. The conduction between the electrodes formed on the first main surface 101 and the second main surface 102 may be established by means other than the through electrode in the through hole (for example, by a wiring formed on the inner wall surface or the like of the external frame part 12).

As shown in FIGS. 4 and 5, two side-surface wirings are formed on the side surface of the crystal resonator plate 10. More specifically, the first side-surface wiring 171 is formed on a side surface 103 of the crystal resonator plate 10 in the −X direction. The second side-surface wiring 172 is formed on a side surface 104 of the crystal resonator plate 10 in the +X direction.

The first side-surface wiring 171 is formed on a part of the side surface 103 in the +Z' direction. The side surface 103 is a side surface of the crystal resonator plate 10 in the −X direction. The first side-surface wiring 171 is connected to the interlayer wiring bonding pattern 181 provided on the first main surface 101 of the crystal resonator plate 10. The first side-surface wiring 171 is also connected to the interlayer wiring bonding pattern 183 provided on the second main surface 202 of the crystal resonator plate 10.

The second side-surface wiring 172 is formed on a part of the side surface 104 in the −Z' direction. The side surface 104 is a side surface of the crystal resonator plate 10 in the +X direction. The second side-surface wiring 172 is connected to the interlayer wiring bonding pattern 182 provided on the first main surface 101 of the crystal resonator plate 10. The second side-surface wiring 172 is also connected to the interlayer wiring bonding pattern 184 provided on the second main surface 202 of the crystal resonator plate 10.

As shown in FIGS. 4 and 5, two internal wirings are formed on the inner wall surface of the external frame part 12 of the crystal resonator plate 10. Specifically, a first internal wiring 173 is formed on an inner wall surface 105 of the external frame part 12 of the crystal resonator plate 10. The inner wall surface 105 is a surface in the −X direction. A second internal wiring 174 is formed on an inner wall surface 106 of the external frame part 12 of the crystal resonator plate 10. The inner wall surface 106 is a surface in the +X direction.

The first internal wiring 173 is provided on a center part of the inner wall surface 105, which is in the −X direction, of the external frame part 12 such that the first internal wiring 173 has a predetermined width. The first internal wiring 173 is connected to the resonator-plate-side first bonding pattern 121 provided on the first main surface 101 of the crystal resonator plate 10. The first internal wiring 173 is also connected to the resonator-plate-side second bonding pattern 122 provided on the second main surface 102 of the crystal resonator plate 10.

The second internal wiring 174 is provided on a center part of the inner wall surface 106, which is in the +X direction, of the external frame part 12 such that the second internal wiring 174 has a predetermined width. The second internal wiring 174 is connected to the resonator-plate-side first bonding pattern 121 provided on the first main surface 101 of the crystal resonator plate 10. The second internal wiring 174 is also connected to the resonator-plate-side second bonding pattern 122 provided on the second main surface 102 of the crystal resonator plate 10. The first internal wiring 173 and the second internal wiring 174 is disposed so as to face each other with the vibrating part 11 being interposed therebetween.

Figure 2:
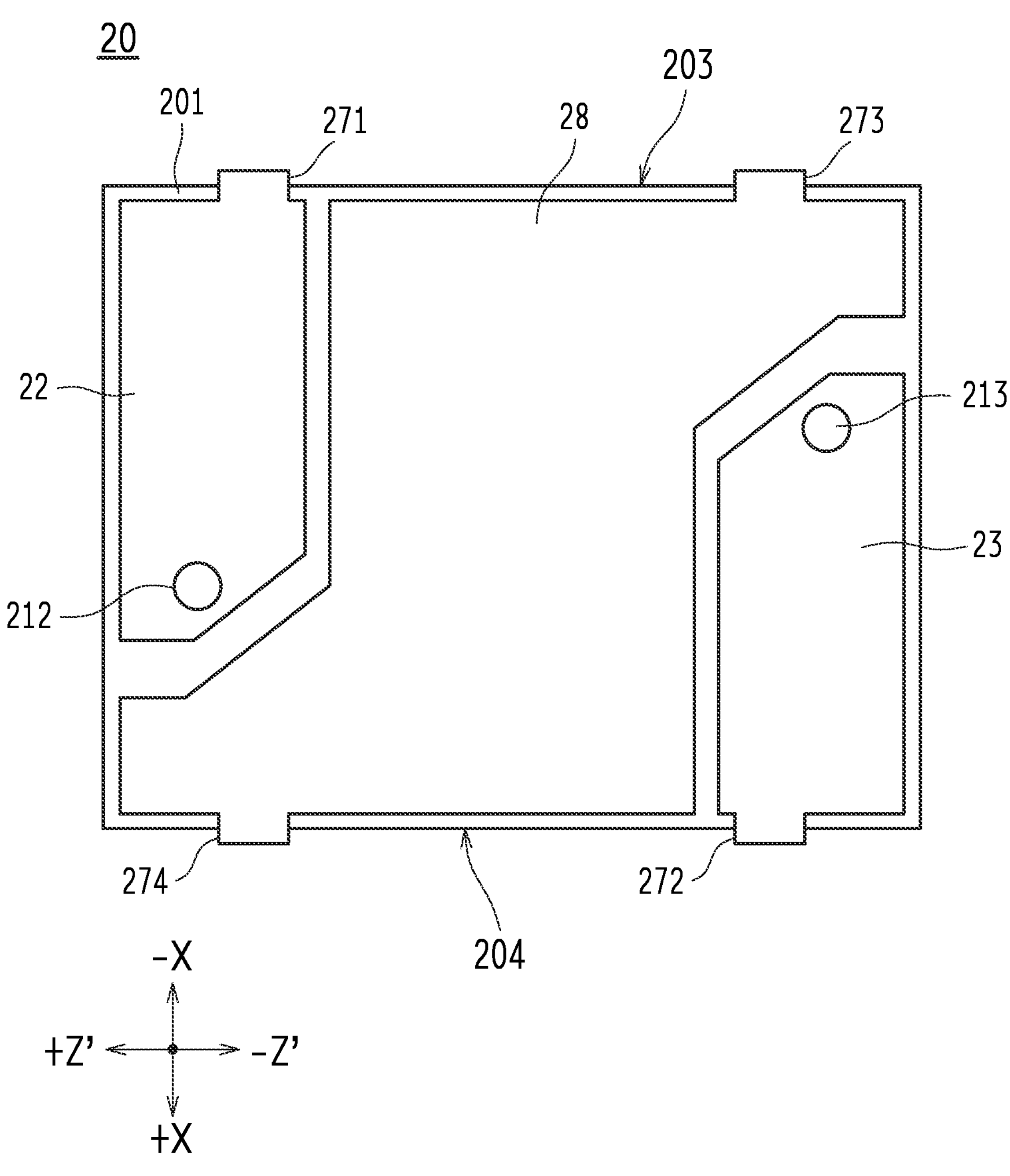
FIG. 2 is a schematic plan view illustrating a first main surface of a first sealing member of the crystal resonator.
Figure 3:
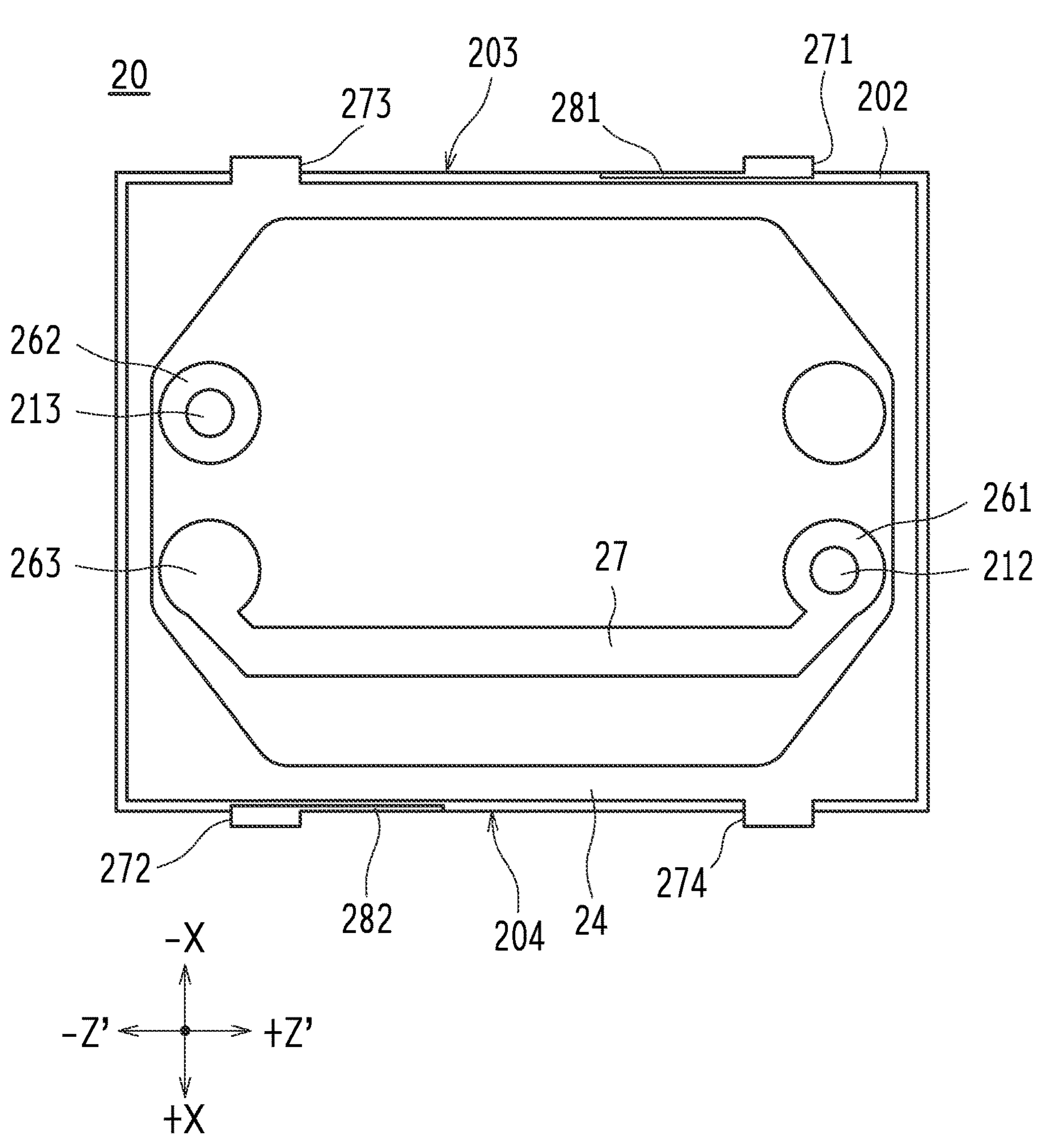
FIG. 3 is a schematic plan view illustrating a second main surface of the first sealing member of the crystal resonator.

As shown in FIGS. 2 and 3, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, the Y axis and the Z' axis of the first sealing member 20 are the same as those of the crystal resonator plate 10.

On a first main surface 201 (an outer main surface not facing the crystal resonator plate 10) of the first sealing member 20, first and second terminals 22 and 23 for wiring and a metal film 28 for shielding (for ground connection) are formed, as shown in FIG. 2. The first and second terminals 22 and 23 for wiring are provided as wirings to electrically connect the first and second excitation electrodes 111 and 112 of the crystal resonator plate 10 to external electrode terminals 32 of the second sealing member 30. The first and second terminals 22 and 23 are disposed at respective end parts in the Z' axis direction. The first terminal 22 is disposed in the +Z' direction, and the second terminal 23 is disposed in the −Z' direction. The first and second terminals 22 and 23 are formed so as to extend in the X axis direction. The first terminal 22 and the second terminal 23 are each formed so as to have a substantially rectangular shape. The first terminal 22 extends to an end of the first main surface 201 in the −X direction so as to be connected to a third side-surface wiring 271 (described later). The second terminal 23 extends to an end of the first main surface 201 in the +X direction so as to be connected to a fourth side-surface wiring 272 (described later).

The metal film 28 is disposed between the first terminal 22 and the second terminal 23 at a predetermined distance from both the first terminal 22 and the second terminal 23. The metal film 28 is provided over almost the entire area of the first main surface 201 of the first sealing member 20, except for the area where the first terminal 22 and the second terminal 23 are provided. The metal film 28 is provided so as to cover from the end of the first main surface 201 of the first sealing member 20 in the +X direction to the end thereof in the −X direction. The metal film 28 extends to the end of the first main surface 201 in the −X direction so as to be connected to a fifth side-surface wiring 273 (described later). Also, the metal film 28 extends to the end of the first main surface 201 in the +X direction so as to be connected to a sixth side-surface wiring 274 (described later).

As shown in FIGS. 2 and 3, two through holes are formed in the first sealing member 20 so as to penetrate between the first main surface 201 and the second main surface 202. More specifically, a second through hole 212 and a third through hole 213 are respectively disposed in the +Z' direction and in the −Z' direction in FIGS. 2 and 3.

In the second through hole 212 and the third through hole 213, through electrodes are respectively formed along a corresponding inner wall surface of the second and third through holes 212 and 213 so as to establish conduction between the electrodes formed on the first main surface 201 and the second main surface 202. Respective center parts of the second and third through holes 212 and 213 are hollow penetrating parts penetrating between the first main surface 201 and the second main surface 202. The through electrode in the second through hole 212 is electrically connected to the first terminal 22. The through electrode in the third through hole 213 is electrically connected to the second terminal 23.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view. The outer peripheral edge of the sealing-member-side first bonding pattern 24 is disposed so as to be adjacent to the outer peripheral edge of the second main surface 202 of the first sealing member 20. On the second main surface 202 of the first sealing member 20, a connection bonding pattern 261 is formed on the periphery of the second through hole 212, and a connection bonding pattern 262 is formed on the periphery of the third through hole 213. Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

On the second main surface 202 of the first sealing member 20, interlayer wiring bonding patterns 281 and 282 are formed on the outer peripheral side of the sealing-member-side first bonding pattern 24. The interlayer wiring bonding patterns 281 and 282 are not connected to the sealing-member-side first bonding pattern 24, but are disposed at a predetermined distance from the sealing-member-side first bonding pattern 24. The interlayer wiring bonding pattern 281 is provided on a part of the second main surface 202 of the first sealing member 20 in the −X direction and in the +Z' direction, and connected to the third side-surface wiring 271 described later. The interlayer wiring bonding pattern 282 is provided on a part of the second main surface 202 of the first sealing member 20 in the +X direction and in the −Z' direction, and connected to the fourth side-surface wiring 272 described later.

As shown in FIGS. 2 and 3, four side-surface wirings are formed on the side surface of the first sealing member 20. More specifically, the third side-surface wiring 271 and the fifth side-surface wiring 273 are formed on a side surface 203 of the first sealing member 20 in the −X direction. The fourth side-surface wiring 272 and the sixth side-surface wiring 274 are formed on a side surface 204 of the first sealing member 20 in the +X direction.

The third side-surface wiring 271 is formed on a part of the side surface 203 in the +Z' direction. The side surface 203 is a side surface of the first sealing member 20 in the −X direction. The third side-surface wiring 271 is connected to the first terminal 22 provided on the first main surface 201 of the first sealing member 20. The third side-surface wiring 271 is also connected to the interlayer wiring bonding pattern 281 provided on the second main surface 202 of the first sealing member 20.

The fourth side-surface wiring 272 is formed on a part of the side surface 204 in the −Z' direction. The side surface 204 is a side surface of the first sealing member 20 in the +X direction. The fourth side-surface wiring 272 is connected to the second terminal 23 provided on the first main surface 201 of the first sealing member 20. The fourth side-surface wiring 272 is also connected to the interlayer wiring bonding pattern 282 provided on the second main surface 202 of the first sealing member 20.

The fifth side-surface wiring 273 is formed on a part of the side surface 203 in the −Z' direction. The side surface 203 is a side surface of the first sealing member 20 in the −X direction. The fifth side-surface wiring 273 is connected to the metal film 28 provided on the first main surface 201 of the first sealing member 20. The fifth side-surface wiring 273 is also connected to the sealing-member-side first bonding pattern 24 provided on the second main surface 202 of the first sealing member 20.

The sixth side-surface wiring 274 is formed on a part of the side surface 204 in the +Z' direction. The side surface 204 is a side surface of the first sealing member 20 in the +X direction. The sixth side-surface wiring 274 is connected to the metal film 28 provided on the first main surface 201 of the first sealing member 20. The sixth side-surface wiring 274 is also connected to the sealing-member-side first bonding pattern 24 provided on the second main surface 202 of the first sealing member 20.

Figure 6:
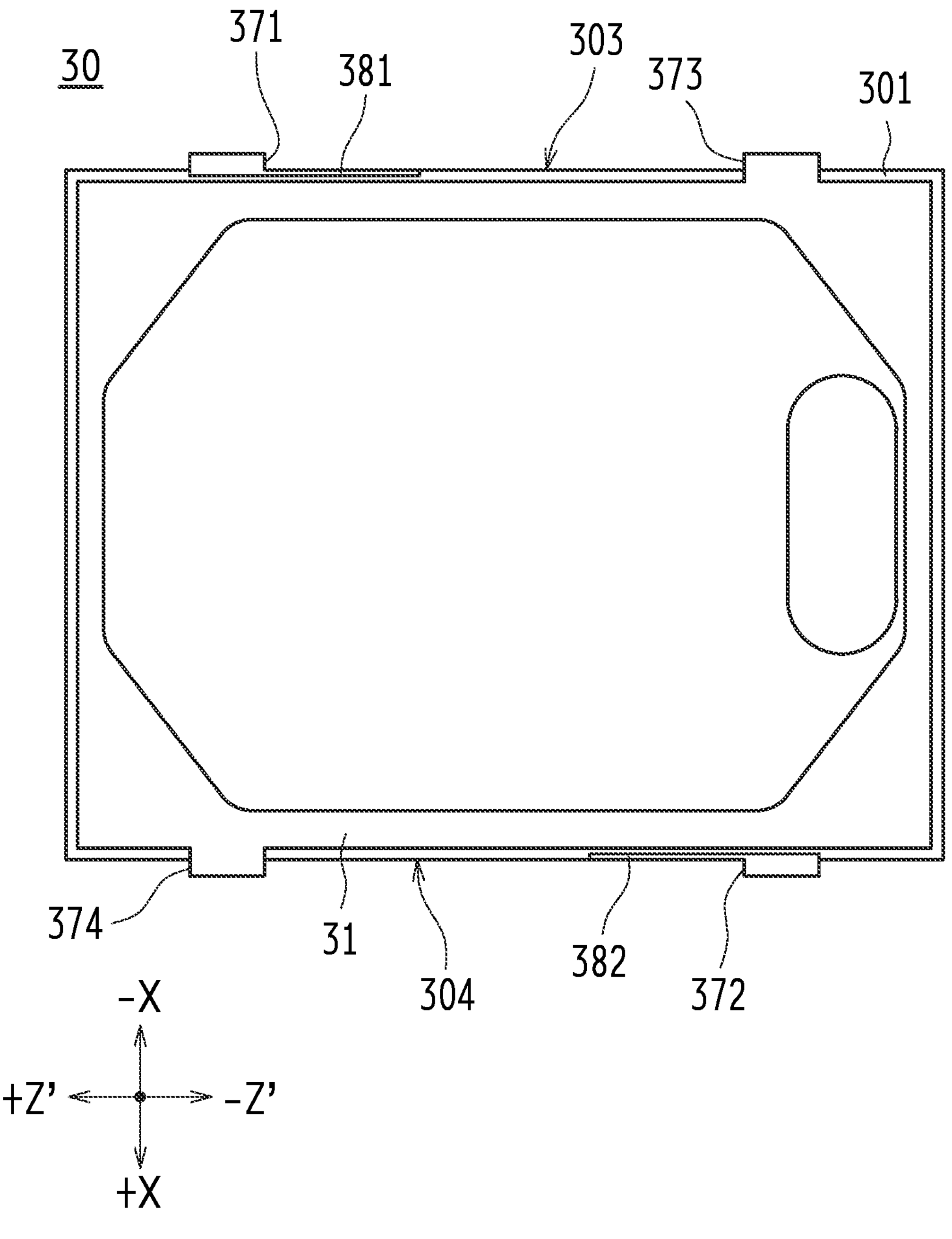
FIG. 6 is a schematic plan view illustrating a first main surface of a second sealing member of the crystal resonator.
Figure 7:
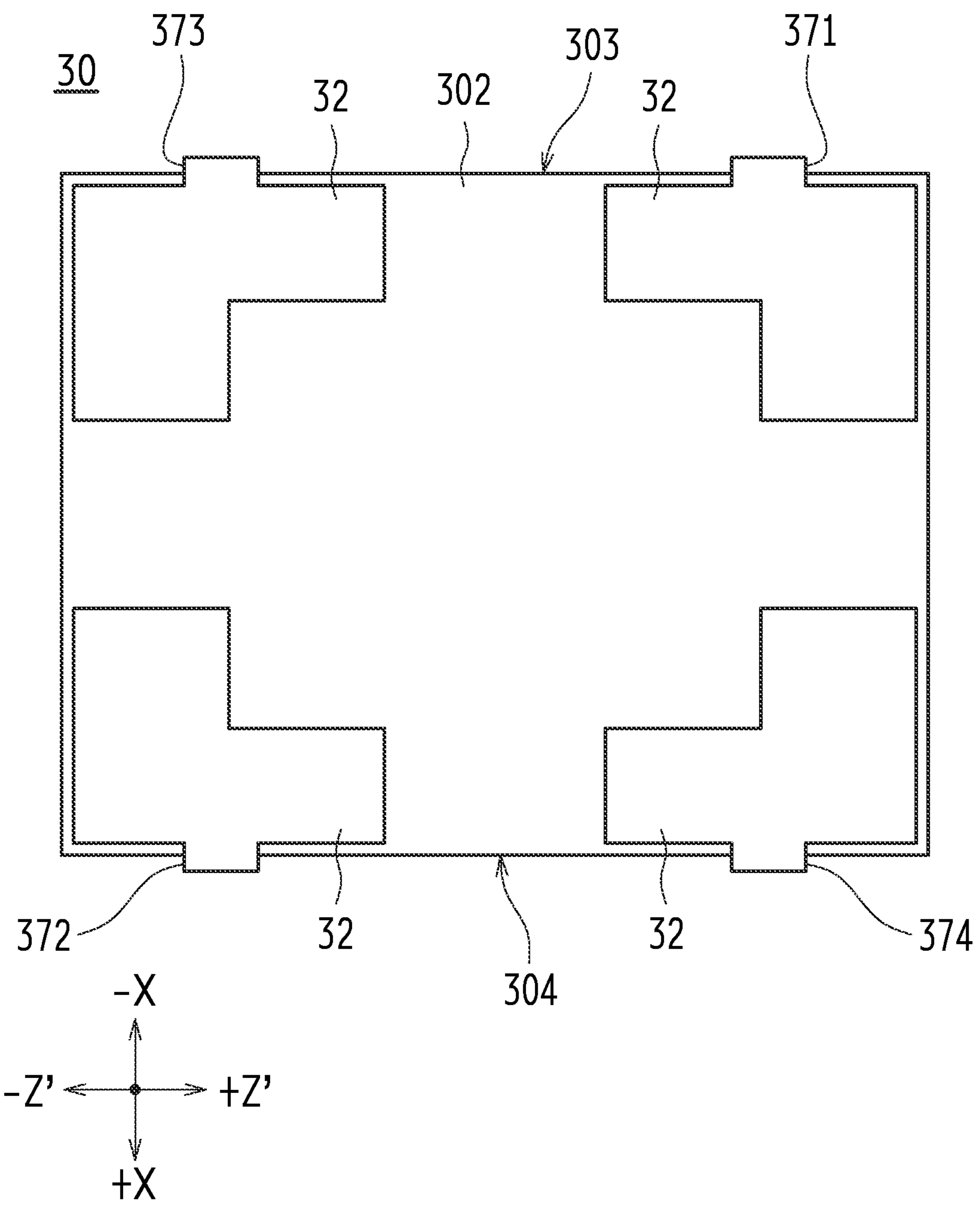
FIG. 7 is a schematic plan view illustrating a second main surface of the second sealing member of the crystal resonator.

As shown in FIGS. 6 and 7, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, the Y axis and the Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view. The outer peripheral edge of the sealing-member-side second bonding pattern 31 is disposed so as to be adjacent to the outer peripheral edge of the first main surface 301 of the second sealing member 30.

On a first main surface 301 of the second sealing member 30, interlayer wiring bonding patterns 381 and 382 are formed on the outer peripheral side of the sealing-member-side second bonding pattern 31. The interlayer wiring bonding patterns 381 and 382 are not connected to the sealing-member-side second bonding pattern 31, but are disposed at a predetermined distance from the sealing-member-side second bonding pattern 31. The interlayer wiring bonding pattern 381 is provided on a part of the first main surface 301 of the second sealing member 30 in the −X direction and in the +Z' direction, and connected to a seventh side-surface wiring 371 described later. The interlayer wiring bonding pattern 382 is provided on a part of the first main surface 301 of the second sealing member 30 in the +X direction and in the −Z' direction, and connected to an eighth side-surface wiring 372 described later.

On a second main surface 302 (the outer main surface not facing the crystal resonator plate 10) of the second sealing member 30, the four external electrode terminals 32 are formed, which are electrically connected to an external circuit board provided outside the crystal resonator 100. The external electrode terminals 32 are respectively located on four corners (corner parts) on the second main surface 302 of the second sealing member 30. The external electrode terminals 32 are respectively disposed along the internal space of the package of the crystal resonator 100 in plan view, and each have a substantially L-shape. The external electrode terminals 32 are also disposed so as to be superimposed on the external frame part 12 of the crystal resonator plate 10 in plan view.

As shown in FIGS. 6 and 7, four side-surface wirings are formed on the side surface of the second sealing member 30. More specifically, the seventh side-surface wiring 371 and a ninth side-surface wiring 373 are formed on a side surface 303 of the second sealing member 30 in the −X direction. The eighth side-surface wiring 372 and a tenth side-surface wiring 374 are formed on a side surface 304 of the second sealing member 30 in the +X direction.

The seventh side-surface wiring 371 is formed on a part of the side surface 303 in the +Z' direction. The side surface 303 is a side surface of the second sealing member 30 in the −X direction. The seventh side-surface wiring 371 is connected to the interlayer wiring bonding pattern 381 provided on the first main surface 301 of the second sealing member 30. The seventh side-surface wiring 371 is also connected to the external electrode terminal 32 provided on the second main surface 302 of the second sealing member 30.

The eighth side-surface wiring 372 is formed on a part of the side surface 304 in the −Z' direction. The side surface 304 is a side surface of the second sealing member 30 in the +X direction. The eighth side-surface wiring 372 is connected to the interlayer wiring bonding pattern 382 provided on the first main surface 301 of the second sealing member 30. The eighth side-surface wiring 372 is also connected to the external electrode terminal 32 provided on the second main surface 302 of the second sealing member 30.

The ninth side-surface wiring 373 is formed on a part of the side surface 303 in the −Z' direction. The side surface 303 is a side surface of the second sealing member 30 in the −X direction. The ninth side-surface wiring 373 is connected to the sealing-member-side second bonding pattern 31 provided on the first main surface 301 of the second sealing member 30. The ninth side-surface wiring 373 is also connected to the external electrode terminal 32 provided on the second main surface 302 of the second sealing member 30.

The tenth side-surface wiring 374 is formed on a part of the side surface 304 in the +Z' direction. The side surface 304 is a side surface of the second sealing member 30 in the +X direction. The tenth side-surface wiring 374 is connected to the sealing-member-side second bonding pattern 31 provided on the first main surface 301 of the second sealing member 30. The tenth side-surface wiring 374 is also connected to the external electrode terminal 32 provided on the second main surface 302 of the second sealing member 30.

Figure 8:
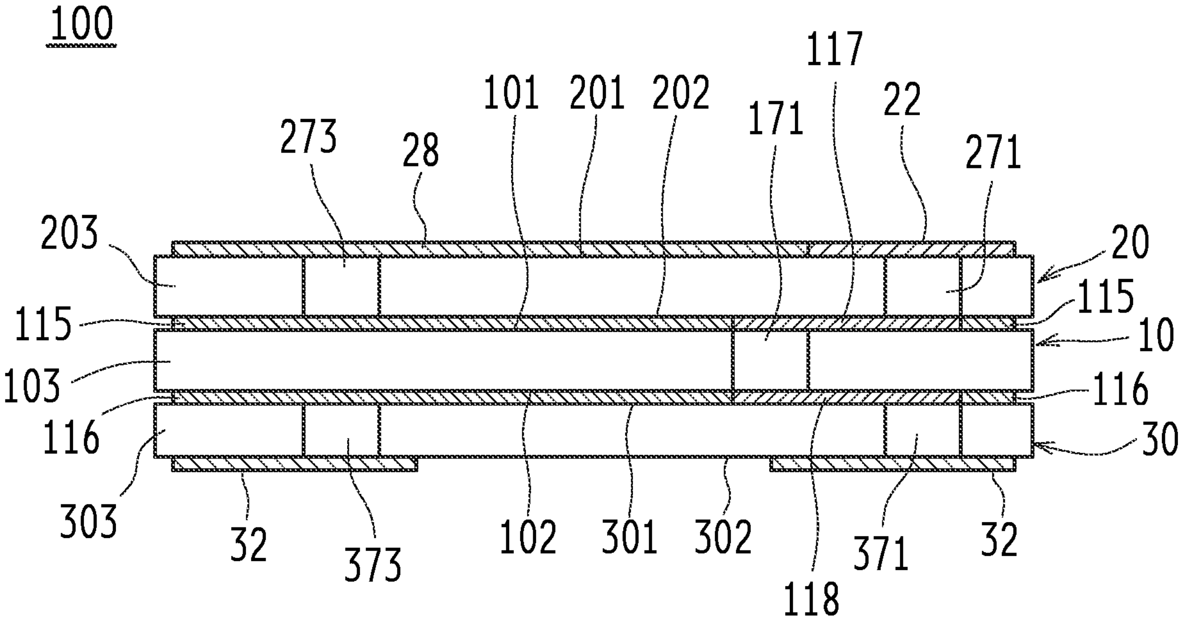
FIG. 8 is a schematic side view illustrating the crystal resonator in the −X direction.
Figure 8:
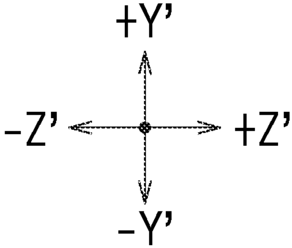
Figure 9:
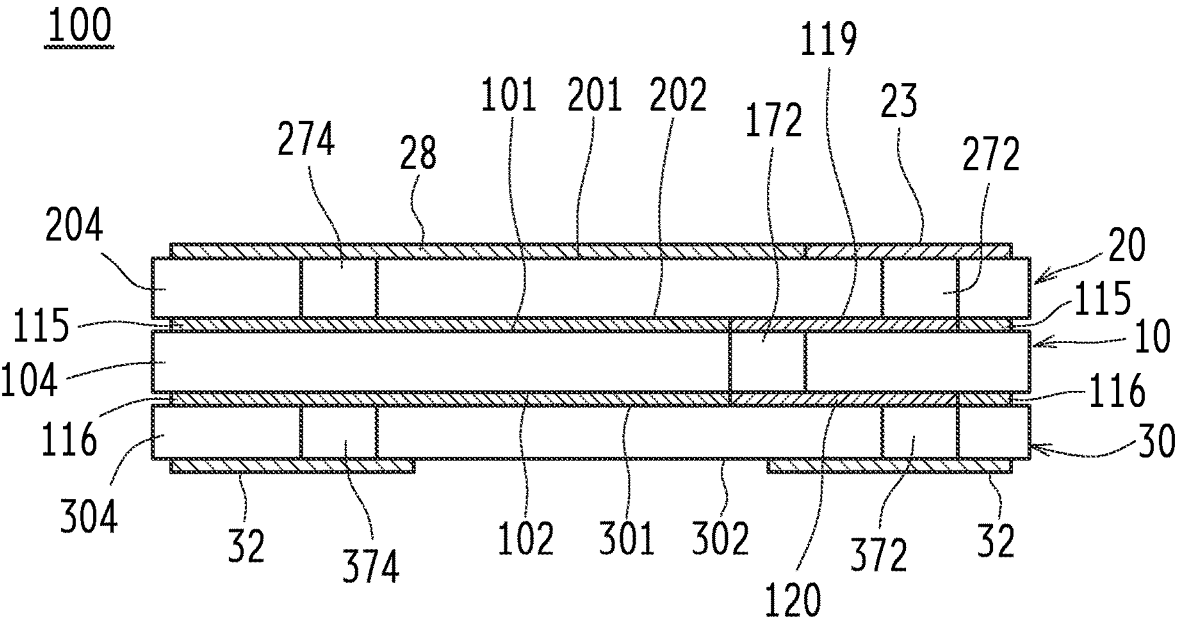
FIG. 9 is a schematic side view illustrating the crystal resonator in the +X direction.
Figure 9:
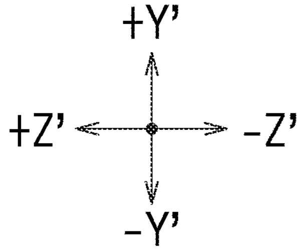

In the crystal resonator 100 including the crystal resonator plate 10, the first sealing member 20 and the second sealing member 30, the crystal resonator plate 10 and the first sealing member 20 are subjected to diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIGS. 1, 8 and 9 is produced. Accordingly, the internal space of the package, i.e. the space to house the vibrating part 11 is hermetically sealed.

In the crystal resonator 100, sealing parts (seal paths) 115 and 116 that hermetically seal the vibrating part 11 of the crystal resonator plate 10 are formed so as to have an annular shape in plan view. The seal path 115 is formed by the diffusion bonding (Au—Au bonding) of the resonator-plate-side first bonding pattern 121 and the sealing-member-side first bonding pattern 24 as described above. The inner edge of the seal path 115 has a substantially octagonal shape. The outer edge of the seal path 115 has a substantially rectangular shape, and the outer peripheral edge of the seal path 115 is disposed so as to be adjacent to the outer peripheral edge of the package. In the same way, the seal path 116 is formed by the diffusion bonding (Au—Au bonding) of the resonator-plate-side second bonding pattern 122 and the sealing-member-side second bonding pattern 31 as described above. The inner edge of the seal path 116 has a substantially octagonal shape. The outer edge of the seal path 116 has a substantially rectangular shape, and the outer peripheral edge of the seal path 116 is disposed so as to be adjacent to the outer peripheral edge of the package.

In the crystal resonator 100 having the seal paths 115 and 116 formed by the diffusion bonding as described above, the first sealing member 20 and the crystal resonator plate 10 have a gap of not more than 1.00 μm. The second sealing member 30 and the crystal resonator plate 10 have a gap of not more than 1.00 μm. That is, the thickness of the seal path 115 between the first sealing member 20 and the crystal resonator plate 10 is not more than 1.00 μm, and the thickness of the seal path 116 between the second sealing member 30 and the crystal resonator plate 10 is not more than 1.00 μm (specifically, the thickness in the Au—Au bonding in this embodiment is 0.15 to 1.00 μm). As a comparative example, the conventional metal paste sealing material containing Sn has a thickness of 5 to 20 μm.

The respective connection bonding patterns as well as the respective interlayer wiring bonding patterns as described above are also subjected to the diffusion bonding in a state in which they are each superimposed on the corresponding connection bonding pattern/interlayer wiring bonding pattern. Such kinds of bonding between the connection bonding patterns and between the interlayer wiring bonding patterns allow electrical conduction between the first excitation electrode 111 and the second excitation electrode 112, and the external electrode terminals 32 of the crystal resonator 100. More specifically, the first excitation electrode 111 is connected to the external electrode terminal 32 via the first lead-out wiring 113, the wiring pattern 27, the second through hole 212, the first terminal 22, the third side-surface wiring 271, a first interlayer wiring 117, the first side-surface wiring 171, a second interlayer wiring 118, and the seventh side-surface wiring 371 in this order. The first interlayer wiring 117 is a wiring disposed between the layers made of the first sealing member 20 and the crystal resonator plate 10. The first interlayer wiring 117 is formed by the diffusion bonding of the interlayer wiring bonding pattern 281 formed on the second main surface 202 of the first sealing member 20 and the interlayer wiring bonding pattern 181 formed on the first main surface 101 of the crystal resonator plate 10. As shown in FIG. 8, the third side-surface wiring 271 is connected to an end of the first interlayer wiring 117 in the +Z' direction, and the first side-surface wiring 171 is connected to an end of the first interlayer wiring 117 in the −Z' direction. The second interlayer wiring 118 is a wiring disposed between the layers made of the crystal resonator plate 10 and the second sealing member 30. The second interlayer wiring 118 is formed by the diffusion bonding of the interlayer wiring bonding pattern 183 formed on the second main surface 102 of the crystal resonator plate 10 and the interlayer wiring bonding pattern 381 formed on the first main surface 301 of the second sealing member 30. As shown in FIG. 8, the first side-surface wiring 171 is connected to an end of the second interlayer wiring 118 in the −Z' direction, and the seventh side-surface wiring 371 is connected to an end of the second interlayer wiring 118 in the +Z' direction.

The second excitation electrode 112 is connected to the external electrode terminal 32 via the second lead-out wiring 114, the first through hole 162, the third through hole 213, the second terminal 23, the fourth side-surface wiring 272, a third interlayer wiring 119, the second side-surface wiring 172, a fourth interlayer wiring 120, and the eighth side-surface wiring 372 in this order. The third interlayer wiring 119 is a wiring disposed between the layers made of the first sealing member 20 and the crystal resonator plate 10. The third interlayer wiring 119 is formed by the diffusion bonding of the interlayer wiring bonding pattern 282 formed on the second main surface 202 of the first sealing member 20 and the interlayer wiring bonding pattern 182 formed on the first main surface 101 of the crystal resonator plate 10. As shown in FIG. 9, the fourth side-surface wiring 272 is connected to an end of the third interlayer wiring 119 in the −Z' direction, and the second side-surface wiring 172 is connected to an end of the third interlayer wiring 119 in the +Z' direction. The fourth interlayer wiring 120 is a wiring disposed between the layers made of the crystal resonator plate 10 and the second sealing member 30. The fourth interlayer wiring 120 is formed by the diffusion bonding of the interlayer wiring bonding pattern 184 formed on the second main surface 102 of the crystal resonator plate 10 and the interlayer wiring bonding pattern 382 formed on the first main surface 301 of the second sealing member 30. As shown in FIG. 9, the second side-surface wiring 172 is connected to an end of the fourth interlayer wiring 120 in the +Z' direction, and the eighth side-surface wiring 372 is connected to an end of the fourth interlayer wiring 120 in the −Z' direction.

Furthermore, the metal film 28 is earth-connected (ground connection using parts of the external electrode terminals 32) via the fifth side-surface wiring 273, the seal path 115, the first internal wiring 173, the seal path 116, and the ninth side-surface wiring 373 in this order. In the same way, the metal film 28 is earth-connected (ground connection using parts of the external electrode terminals 32) via the sixth side-surface wiring 274, the seal path 115, the second internal wiring 174, the seal path 116, and the tenth side-surface wiring 374 in this order.

In this embodiment, the respective electric conduction paths between the first excitation electrodes 111 and the external electrode terminal 32 and between the second excitation electrode 112 and the external electrode terminal 32 are not electrically connected to the annular seal paths 115 and 116.

More specifically, the first excitation electrode 111 is electrically connected, inside the annular seal paths 115 and 116 in plan view, to the first terminal 22 on the first main surface 201 of the first sealing member 20 via the through electrode in the second through hole 212. The first terminal 22 is disposed over the inside and the outside of the annular seal paths 115 and 116 in plan view. Also, the first terminal 22 is electrically connected, outside the annular seal paths 115 and 116 in plan view, to the external electrode terminal 32 on the second main surface 302 of the second sealing member 30 via the side-surface wirings 271, 171 and 371 formed on the side surface of the package of the crystal resonator 100. The electric conduction path between the first excitation electrode 111 and the external electrode terminal 32 is not electrically connected to the annular seal paths 115 and 116.

Similarly to the above, the second excitation electrode 112 is electrically connected, inside the annular seal paths 115 and 116 in plan view, to the second terminal 23 on the first main surface 201 of the first sealing member 20 via the through electrode in the first through hole 162 and the through electrode in the third through hole 213. The second terminal 23 is disposed over the inside and the outside of the annular seal paths 115 and 116 in plan view. Also, the second terminal 23 is electrically connected, outside the annular seal paths 115 and 116 in plan view, to the external electrode terminal 32 on the second main surface 302 of the second sealing member 30 via the side-surface wirings 272, 172 and 372 formed on the side surface of the package of the crystal resonator 100. The electric conduction path between the second excitation electrode 112 and the external electrode terminal 32 is not electrically connected to the annular seal paths 115 and 116.

In the crystal resonator 100, the above-described bonding patterns are each preferably made of a plurality of layers laminated on the crystal plate, specifically, a Ti (titanium) layer and an Au (gold) layer deposited by the vapor deposition or sputtering in this order from the lowermost layer side. Also, the other wirings and electrodes formed on the crystal resonator 100 each preferably have the same configuration as the bonding patterns, which leads to patterning of the bonding patterns, wirings and the electrodes at the same time.

In the above-described crystal resonator 100 in this embodiment, the metal film 28 is provided as a grounding electrode on the first main surface (a main surface not facing the internal space) 201 of the first sealing member 20. The metal film 28 is electrically connected to the external electrode terminal 32 formed on the second main surface (a main surface not facing the internal space) 302 of the second sealing member 30 via the first internal wiring 173 formed on the inner wall surface 105 of the external frame part 12 of the crystal resonator plate 10. The metal film 28 is also electrically connected to the external electrode terminal 32 formed on the second main surface 302 of the second sealing member 30 via the second internal wiring 174 formed on the inner wall surface 106 of the external frame part 12 of the crystal resonator plate 10. In this way, since the internal wirings 173 and 174 for ground connection are provided on the inner wall surfaces 105 and 106 of the external frame part 12 of the crystal resonator plate 10, it is possible to prevent the influence of the external environment, which leads to stable ground connection.

In the manufacturing process of the crystal resonator 100, the crystal resonator plate 10 is manufactured as a wafer. In the wafer of the crystal resonator plate 10, the electrode composition of the first internal wiring 173, the second internal wiring 174 and the like is common with the electrode composition of the first and second excitation electrodes 111 and 112 of the vibrating part 11. Therefore, the base electrode film (for example, a Ti film) of the first internal wiring 173 and the second internal wiring 174 is formed to have a thin thickness compared to the electrode composition of the first and second sealing members 20 and 30. As a result, when mounting the package of the crystal resonator 100 by soldering, the solder may erode the electrodes formed on the side surfaces of the package and thus cause disconnection of wiring, which may prevent stable ground connection. However, in this embodiment, since the first internal wiring 173 (second internal wiring 174) for ground connection is provided on the inner wall surface 105 (106) of the external frame part 12 of the crystal resonator plate 10, it is possible to prevent the disconnection due to solder erosion, and thus to perform stable ground connection via the first internal wiring 173 (second internal wiring 174).

In this embodiment as described above, the annular seal paths 115 and 116 are electrically connected to the first internal wiring 173 (second internal wiring 174). In this way, the vibrating part 11 of the crystal resonator plate 10 is surrounded by the earth-connected annular seal paths 115 and 116, which contributes to improvement of electromagnetic shielding effect.

Also in this embodiment, the first internal wiring 173 (second internal wiring 174) is formed so as to have a planar shape that extends along the inner wall surface 105 (106) of the external frame part 12 of the crystal resonator plate 10. Thus, it is possible to improve the electromagnetic shielding effect by the first internal wiring 173 (second internal wiring 174) formed on the inner wall surface 105 (106) of the external frame part 12 so as to have a planar shape. In this case, the first internal wiring 173 and the second internal wiring 174 are respectively provided on the pair of inner wall surfaces 105 and 106, which faces each other in plan view, of the external frame part 12 of the crystal resonator plate 10. Thus, it is possible to effectively shield electromagnetic waves from the lateral sides of the vibrating part 11 since the vibrating part 11 is interposed between the pair of first internal wiring 173 and the second internal wiring 174 both having a planar shape. Furthermore, the respective widths of the first and second internal wirings 173 and 174 in the extending direction thereof (i.e. in the Z' axis direction) are larger than the respective widths of the first and second excitation electrodes 111 and 112. Thus, it is possible to further enhance the electromagnetic shielding effect.

In this embodiment as described above, the metal film 28 provided on the first main surface 201, which does not face the internal space, of the first sealing member 20 is electrically connected to the fifth side-surface wiring 273 formed on the side surface 203 of the first sealing member 20 in the −X direction, and the external electrode terminal 32 of the second sealing member 30 is electrically connected to the ninth side-surface wiring 373 formed on the side surface 303 of the second sealing member 30 in the −X direction. Also, the metal film 28 of the first sealing member 20 is electrically connected to the sixth side-surface wiring 274 formed on the side surface 204 of the first sealing member 20 in the +X direction, and the external electrode terminal 32 of the second sealing member 30 is electrically connected to the tenth side-surface wiring 374 formed on the side surface 304 of the second sealing member 30 in the +X direction. With this configuration, it is not necessary to provide any through holes for electrical connection in the first and second sealing members 20 and 30 outside the seal paths 115 and 116. Thus, this configuration can be easily adapted to the size reduction of the crystal resonator 100. Furthermore, the metal film 28 is provided on the first main surface 201, which does not face the internal space, of the first sealing member 20. Thus, it is possible to avoid preventing the wirings from being formed in the internal space, which also prevents short-circuits with the first and second excitation electrodes 111 and 112. In addition, since the metal film 28 is formed on the surface of the package that keeps a relative distance from the first and second excitation electrodes 111 and 112, it is possible to further enhance the electromagnetic shielding effect.

As shown in FIG. 4 in this embodiment, the first side-surface wiring 171 is provided on the side surface 103 of the crystal resonator plate 10 in the −X direction so as to be electrically connected to the first excitation electrode 111. Also, the first internal wiring 173 is disposed between the first side-surface wiring 171 and the first excitation electrode 111. Although the first side-surface wiring 171 and the first excitation electrode 111 are superimposed on each other in side view, it is possible to reduce stray capacity derived from the superimposing of the first side-surface wiring 171 and the first excitation electrode 111 by disposing the earth-connected first internal wiring 173 between the first side-surface wiring 171 and the first excitation electrode 111.

Also as shown in FIG. 5, the second side-surface wiring 172 is provided on the side surface 104 of the crystal resonator plate 10 in the +X direction so as to be electrically connected to the second excitation electrode 112. Also, the second internal wiring 174 is disposed between the second side-surface wiring 172 and the second excitation electrode 112. Although the second side-surface wiring 172 and the second excitation electrode 112 are superimposed on each other in side view, it is possible to reduce stray capacity derived from the superimposing of the second side-surface wiring 172 and the second excitation electrode 112 by disposing the earth-connected second internal wiring 174 between the second side-surface wiring 172 and the second excitation electrode 112.

Also in this embodiment, the first excitation electrode 111 is electrically connected to the first terminal 22 formed on the first main surface 201, which does not face the internal space, of the first sealing member 20 via the through electrode in the second through hole 212 formed in the first sealing member 20. The second excitation electrode 112 is electrically connected to the second terminal 23 formed on the first sealing member 20 via the through electrode in the first through hole 162 formed in the crystal resonator plate 10 and the through electrode in the third through hole 213 formed in the first sealing member 20. The first terminal 22 is electrically connected to the external electrode terminal (first external electrode terminal) 32 formed on the second main surface 302, which does not face the internal space, of the second sealing member 30 via the side-surface wirings 271, 171 and 371 formed on the side surface of the package of the crystal resonator 100. The second terminal 23 is electrically connected to the external electrode terminal (second external electrode terminal) 32 formed on the second main surface 302 of the second sealing member 30 via the side-surface wirings 272, 172 and 372 formed on the side surface of the package of the crystal resonator 100.

In this embodiment, the first and second excitation electrodes 111 and 112 are respectively electrically connected to the external electrode terminals 32 and 32 via the first and second terminals 22 and 23 formed on the first main surface 201 of the first sealing member 20, which is a surface not facing the internal space. Thus, it is possible to elongate the respective electrical conduction paths from the first and second excitation electrodes 111 and 112 to the external electrode terminals 32 and 32, which also can reduce erosion of the first and second excitation electrodes 111 and 112 by solder. It is also possible to prevent increase of the conduction resistance and/or generation of disconnection due to the erosion of the side-surface wirings 271, 171 and 371 and the side-surface wirings 272, 172 and 372 by the solder. Furthermore, since the first and second terminals 22 and 23 are respectively electrically connected to the external electrode terminals 32 and 32 without using the through holes, it is not required to form any through holes in the respective outer peripheral edge parts of the crystal resonator plate 10, the first sealing member 20 and the second sealing member 30. Thus, this configuration can be easily adapted to the size reduction of the crystal resonator 100.

In this case, the side-surface wirings 271, 171 and 371 and the side-surface wirings 272, 172 and 372 are formed without needing of any recess parts (castellation) in the side surface of the package. Thus, since it is not necessary to form any recess parts in the respective side surfaces of the crystal resonator plate 10, the first sealing member 20 and the second sealing member 30, this configuration can be easily adapted to the size reduction of the crystal resonator 100.

In this embodiment, among the side-surface wirings 271, 171 and 371 that are formed on the side surface of the package of the crystal resonator 100, the first side-surface wiring 171 formed on the crystal resonator plate 10 is disposed so as to be displaced from at least the seventh side-surface wiring 371 formed on the second sealing member 30 in plan view. As shown in FIG. 8, the first side-surface wiring 171 of the crystal resonator plate 10 is disposed so as to be displaced from both the third side-surface wiring 271 of the first sealing member 20 and the seventh side-surface wiring 371 of the second sealing member 30 in the −Z' direction in plan view. The first side-surface wiring 171 of the crystal resonator plate 10 is connected to the third side-surface wiring 271 of the first sealing member 20 via the first interlayer wiring 117 while the first side-surface wiring 171 is connected to the seventh side-surface wiring 371 of the second sealing member 30 via the second interlayer wiring 118. In this way, since the first side-surface wiring 171 formed on the crystal resonator plate 10 is disposed so as to be displaced from the third and seventh side-surface wirings 271 and 371 respectively formed on the first and second sealing members 20 and 30, it is possible to block the solder erosion path on the side surface of the package of the crystal resonator 100, which leads to reduction of erosion of the first excitation electrode 111 by the solder.

Also, among the side-surface wirings 272, 172 and 372 that are formed on the side surface of the package of the crystal resonator 100, the second side-surface wiring 172 formed on the crystal resonator plate 10 is disposed so as to be displaced from at least the eighth side-surface wiring 372 formed on the second sealing member 30 in plan view. As shown in FIG. 9, the second side-surface wiring 172 of the crystal resonator plate 10 is disposed so as to be displaced from both the fourth side-surface wiring 272 of the first sealing member 20 and the eighth side-surface wiring 372 of the second sealing member 30 in the +Z' direction in plan view. The second side-surface wiring 172 of the crystal resonator plate 10 is connected to the fourth side-surface wiring 272 of the first sealing member 20 via the third interlayer wiring 119 while the second side-surface wiring 172 is connected to the eighth side-surface wiring 372 of the second sealing member 30 via the fourth interlayer wiring 120. In this way, since the second side-surface wiring 172 formed on the crystal resonator plate 10 is disposed so as to be displaced from the fourth and eighth side-surface wirings 272 and 372 respectively formed on the first and second sealing members 20 and 30, it is possible to block the solder erosion path on the side surface of the package of the crystal resonator 100, which leads to reduction of erosion of the second excitation electrode 112 by the solder.

As to the displacing amount (i.e. the length in the Z' axis direction), it is not particularly limited provided that the side-surface wirings 171 and 172 of the crystal resonator plate 10 are not superimposed on the side-surface wirings 271, 272, 371 and 372 of the first and second sealing members 20 and 30 in side view. In the example shown in FIGS. 8 and 9, there is a gap having substantially the same length as the width of the respective side-surface wirings 171 and 172 of the crystal resonator plate 10 in the Z' axis direction between the side-surface wiring 171 of the crystal resonator plate 10 and the side-surface wiring 371 of the second sealing member 30, and between the side-surface wiring 172 of the crystal resonator plate 10 and the side-surface wiring 372 of the second sealing member 30. Also, there is a gap having substantially the same length as the width of the respective side-surface wirings 171 and 172 of the crystal resonator plate 10 in the Z' axis direction between the side-surface wiring 171 of the crystal resonator plate 10 and the side-surface wiring 271 of the first sealing member 20, and between the side-surface wiring 172 of the crystal resonator plate 10 and the side-surface wiring 272 of the first sealing member 20.

In this embodiment, the crystal resonator plate 10, the first sealing member 20, and the second sealing member 30 are each an AT-cut crystal plate. The side-surface wirings 271, 171 and 371 as well as the side-surface wirings 272, 172 and 372 are formed along the Z' axis direction of the AT-cut crystal plate (on the X axis end surface). Thus, it is possible to easily form the side-surface wirings 271, 171 and 371 and the side-surface wirings 272, 172 and 372 that are stable and not likely to generate disconnection. The description will be given below.

In the manufacturing process of the crystal resonator 100, the crystal resonator plate 10, the first sealing member 20 and the second sealing member 30 are manufactured each as a wafer. Each outer shape of the crystal resonator plate 10, the first sealing member 20 and the second sealing member 30 is formed by wet etching. Here, due to anisotropy of the AT-cut crystal plate, the Z' axis end surface of the crystal resonator plate 10 and the like sometimes has a protruding portion that protrudes in the Z' axis direction. Thus, when forming the side-surface wiring on the Z' axis end surface, the film thickness of the side-surface wiring may be small at the protruding portion, or patterning of the side-surface wiring may be difficult because of a shadow of the protruding portion at the time of exposing.

In contrast, the protruding portion as described above is not formed on the X axis end surface of the crystal resonator plate 10 and the like. The X axis end surface has a shape of a plurality of inclined surfaces that has each an obtuse angle and that is connected to each other. Thus, when forming the side-surface wiring on the X axis end surface of the crystal resonator plate 10 and the like, the film thickness of the side-surface wiring can be easily ensured, and patterning of the side-surface wiring can also be easily performed because the shadow is not likely to be generated at the time of exposing. In this way, it is possible to easily form the side-surface wiring as well as reduce the conduction resistance on the X axis end surface of the crystal resonator plate 10 and the like compared to the Z' axis end surface.

In this embodiment as discussed above, the side-surface wirings 271, 171 and 371 as well as the side-surface wirings 272, 172 and 372 are formed along the Z' axis direction (i.e. on the X axis end surface) of the crystal resonator plate 10, the first sealing member 20 and the second sealing member 30 each made of the AT-cut crystal plate. Thus, it is possible to easily form the side-surface wirings 271, 171 and 371 and the side-surface wirings 272, 172 and 372 that are stable and not likely to generate disconnection.

Not only the side-surface wirings 271, 171 and 371 and the side-surface wirings 272, 172 and 372, but also the side-surface wirings 273 and 373 and the side-surface wirings 274 and 374 are formed along the Z' axis direction of the first sealing member 20 and the second sealing member 30. Thus, it is possible to easily form the side-surface wirings 273 and 373 and the side-surface wirings 274 and 374 that are stable and not likely to generate disconnection.

Also, in the wafer of the crystal resonator plate 10, the electrode composition of the first side-surface wiring 171 and the second side-surface wiring 172 is common with the electrode composition of the first and second excitation electrodes 111 and 112 of the vibrating part 11. Therefore, the base electrode film (for example, a Ti film) of the first side-surface wiring 171 and the second side-surface wiring 172 is formed to have a thin thickness compared to the electrode composition of the first and second sealing members 20 and 30. For example, the electrode composition of the crystal resonator plate 10 contains a Ti film and an Au film while the electrode composition of the first and second sealing members 20 and 30 contains a Ti film, a NiTi film, and an Au film. Also, the Ti film of the electrode composition of the crystal resonator plate 10 is thinner than the Ti film of the electrode composition of the first and second sealing members 20 and 30.

Also in this embodiment, the whole or part of the Au film is removed from the seventh side-surface wiring 371 and the eighth side-surface wiring 372 of the second sealing member 30. Thus, the seventh side-surface wiring 371 and the eighth side-surface wiring 372 of the second sealing member 30 establish conduction by a conductive metal other than Au, which results in an erosion resistance structure to the solder. The detail description will be given below.

On the second main surface 302, which does not face the internal space, of the second sealing member 30 of the crystal resonator 100, the external electrode terminals 32 are formed so as to be electrically connected to an external circuit board via solder. The external electrode terminal 32 is electrically connected to the first excitation electrode 111 via the side-surface wirings 371, 171 and 271 formed on the side surface of the package of the crystal resonator 100. Also, the external electrode terminal 32 is electrically connected to the second excitation electrode 112 via the side-surface wirings 372, 172 and 272 formed on the side surface of the package of the crystal resonator 100. The seventh side-surface wiring 371 and the eighth side-surface wiring 372 of the second sealing member 30 have a erosion resistance structure to the solder.

Figure 10:
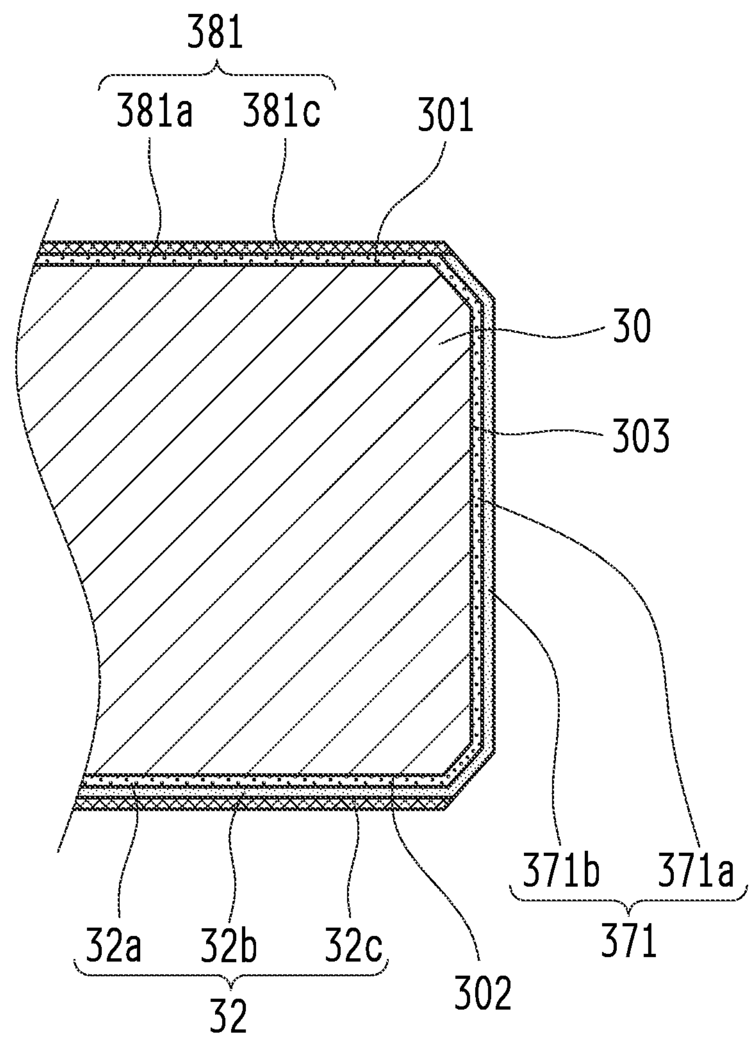
FIG. 10 is a schematic cross-sectional view illustrating the second sealing member of the crystal resonator.

The erosion resistance structure in this embodiment is described with reference to FIG. 10. In FIG. 10, only the erosion resistance structure is shown, which is provided on the seventh side-surface wiring 371 on the side surface 303 of the second sealing member 30 in the −X direction. However, the same erosion resistance structure is also provided on the eighth side-surface wiring 372 on the side surface 304 of the second sealing member 30 in the +X direction.

As shown in FIG. 10, the seventh side-surface wiring 371 is formed on the side surface 303 of the second sealing member 30 in the −X direction. By this seventh side-surface wiring 371, the external electrode terminal 32 formed on the second main surface 302 of the second sealing member 30 is electrically connected to the second interlayer wiring 118 formed on the first main surface 301 of the second sealing member 30.

The seventh side-surface wiring 371 is constituted of: a first metal film 371*a* made of a first conductive metal deposited by vapor deposition or sputtering on the side surface 303 of the second sealing member 30 in the −X direction; and a second metal film 371*b* made of a second conductive metal deposited by vapor deposition or sputtering on the first metal film 371*a*.

The external electrode terminal 32 is constituted of: a first metal film 32*a* made of the first conductive metal deposited by vapor deposition or sputtering on the second main surface 302 of the second sealing member 30; a second metal film 32*b* made of the second conductive metal deposited by vapor deposition or sputtering on the first metal film 32*a*; and an Au film 32*c* made of Au (gold) deposited by, for example, vapor deposition on the second metal film 32*b*.

The second interlayer wiring 118 is formed by bonding the interlayer wiring bonding pattern 381 provided on the first main surface 301 of the second sealing member 30 and the interlayer wiring bonding pattern 183 provided on the second main surface 202 of the crystal resonator plate 10. Since the Au film is removed from the second sealing member 30 in the state of a wafer before the second interlayer wiring 118 is formed (by bonding), only the interlayer wiring bonding pattern 381 is shown in FIG. 10, which is in the state before being formed (by bonding) as the second interlayer wiring 118. The interlayer wiring bonding pattern 381 is constituted of: a first metal film 381*a* made of the first conductive metal deposited by the vapor deposition or sputtering on the first main surface 301 of the second sealing member 30; and an Au film 381*c* made of Au (gold) deposited by vapor deposition or sputtering on the first metal film 381*a*.

In this embodiment, Ti (titanium) is used as the first conductive metal while NiTi (nickel titanium) is used as the second conductive metal. The above first and second conductive metals are exemplarily shown. Other conductive metals may be used. Also, the above multi-layer structure of the seventh side-surface wiring 371, the external electrode terminal 32 and the interlayer wiring bonding pattern 381 is exemplarily shown. The number of layers of the respective electrodes is not particularly limited. For example, the interlayer wiring bonding pattern 381 may have a three-layer structure including the second metal film in the same way as the external electrode terminal 32. Alternatively, the external electrode terminal 32 may have a two-layer structure not including the second metal film in the same way as the interlayer wiring bonding pattern 381.

The first metal film 381*a* of the interlayer wiring bonding pattern 381, the first metal film 371*a* of the seventh side-surface wiring 371, and the first metal film 32*a* of the external electrode terminal 32 are integrally formed. Also, the second metal film 371*b* of the seventh side-surface wiring 371 and the second metal film 32*b* of the external electrode terminal 32 are integrally formed. On the other hand, the Au film 381*c* of the interlayer wiring bonding pattern 381 and the Au film 32*c* of the external electrode terminal 32 are not integrally formed. They are cut off from each other by the side surface 303 of the second sealing member 30 in the −X direction. The seventh side-surface wiring 371 establishes conduction between the interlayer wiring bonding pattern 381 and the external electrode terminal 32 by the conductive material other than Au. In this case, the seventh side-surface wiring 371 can be formed by removing the Au film formed on the side surface 303 of the second sealing member 30 in the −X direction. More specifically, the Au film is also formed in advance on the side surface 303 of the second sealing member 30 in the −X direction, integrally with the Au film 381*c* of the interlayer wiring bonding pattern 381 and the Au film 32*c* of the external electrode terminal 32. Then, the Au film on the side surface 303 of the second sealing member 30 in the −X direction is removed by, for example, metal etching. Thus, the seventh side-surface wiring 371 not including the Au film is formed. In this way, the seventh side-surface wiring 371, from which the Au film was removed, is formed on the side surface 303 of the second sealing member 30 in the −X direction. This removal of the Au film is performed to the second sealing member 30 in the state of wafer, that is, the removal is performed before the second sealing member 30 is bonded to the crystal resonator plate 10.

Here, the Au film on the side surface 303 of the second sealing member 30 in the −X direction may be entirely removed as shown in FIG. 10, or it may be partly removed.

In this embodiment, the whole or part of the Au film is removed from the seventh side-surface wiring 371, and the seventh side-surface wiring 371 establishes conduction by the conductive metal other than Au. Thus, the erosion resistance is ensured.

Specifically, when the crystal resonator 100 is mounted on an external circuit board, solder is generally used, which means that the solder is interposed between the external electrode terminal 32 of the second sealing member 30 and the external circuit board. However, the solder contains Sn (tin), and thus, when the seventh side-surface wiring 371 includes an Au film, the solder may wet and spread inside the seventh side-surface wiring 371 along the Au film. Therefore, due to erosion by the solder, Au that constitutes the Au film agglomerates, which may generate problems such as increase of conduction resistance and disconnection. Consequently, when the seventh side-surface wiring 371 makes conduction by the Au film, this Au film may serve as a solder erosion path.

Thus, in this embodiment, the Au film that may serve as the solder erosion path is removed from the seventh side-surface wiring 371 such that the first metal film 371*a* made of the conductive metal other than Au establishes conduction between the interlayer wiring bonding pattern 381 of the first main surface 301 of the second sealing member 30 and the external electrode terminal 32 of the second main surface 302. Since the surface of the first metal film 371*a* is not covered by the Au film, this surface of the first metal film 371*a* becomes oxidized, which prevents the solder from wetting. In this way, since the solder erosion path on the seventh side-surface wiring 371 can be blocked due to the erosion resistance structure provided on the seventh side-surface wiring 371, it is possible to prevent the solder from wetting and spreading on the conduction path to the first excitation electrode 111. Thus, it is possible to reduce the erosion of the first excitation electrode 111 by the solder. It is also possible to prevent increase of the conduction resistance and/or generation of disconnection due to the solder erosion of the seventh side-surface wiring 371.

In the same way, since the solder erosion path on the eighth side-surface wiring 372 can be blocked due to the erosion resistance structure provided on the eighth side-surface wiring 372, it is possible to prevent the solder from wetting and spreading on the conduction path to the second excitation electrode 112. Thus, it is possible to reduce the erosion of the second excitation electrode 112 by the solder. It is also possible to prevent increase of the conduction resistance and/or generation of disconnection due to the solder erosion of the eighth side-surface wiring 372.

In this embodiment as described above, the metal film on each surface of the seventh and eighth side-surface wirings 371 and 372 is made of a metal having a low wettability against the solder (in this case, NiTi). That is, the metal film on each surface of the seventh and eighth side-surface wirings 371 and 372 is formed by a film containing at least Ti, and furthermore the film containing Ti having low wettability against the solder is exposed. With this configuration, since the solder erosion path on each of the seventh and eighth side-surface wirings 371 and 372 can be blocked, it is possible to prevent the solder from wetting and spreading on each conduction path to the first and second excitation electrodes 111 and 112. Thus, it is possible to reduce the erosion of the first and second excitation electrodes 111 and 112 by the solder. It is also possible to prevent increase of the conduction resistance and/or generation of disconnection due to the solder erosion of the seventh and eighth side-surface wirings 371 and 372.

The above-disclosed embodiment is to be considered in all respects as illustrative and not limiting. The technical scope of the invention is indicated by the appended claims rather than by the foregoing embodiment, and all modifications and changes that come within the meaning and range of equivalency of the claims are intended to be embraced therein.

In the above-described embodiment, two electrode terminals 32 are used, out of the four external electrode terminals 32, as the electrode terminals for ground connection. However, only one external electrode terminal 32 may be used as the electrode terminal for ground connection. For example, the tenth side-surface wiring 374 may be directly connected to the external electrode terminal 32 so that the ninth side-surface wiring 373 is electrically connected to this external electrode terminal 32 via the metal film 28. In this case, the ninth side-surface wiring 373 is electrically connected to the metal film 28 via the seal path 116, the first internal wiring 173, the seal path 115, and the fifth side-surface wiring 273 in this order. Also, the ninth side-surface wiring 373 is electrically connected to the external electrode terminal 32 via the sixth side-surface wiring 274, the seal path 115, the second internal wiring 174, the seal path 116, and the tenth side-surface wiring 374 in this order. Furthermore, either one of the first internal wiring 173 and the second internal wiring 174 may be formed.

In the above-described embodiment, the earth-connected first and second internal wirings 173 and 174 are respectively formed on the inner wall surfaces 105 and 106 of the external frame part 12 of the crystal resonator plate 10. In place of the above, the earth-connected side-surface wirings may be respectively formed on the outer side surfaces (for example, the side surfaces 103 and 104) of the crystal resonator plate 10.

In the above-described embodiment, the first and second internal wirings 173 and 174 are respectively formed on the inner wall surface 105 in the −X direction and the inner wall surface 106 in the +X direction, of the external frame part 12 of the crystal resonator plate 10. In place of the above, the internal wirings may be respectively formed on the inner wall surface in the −Z' direction and the inner wall surface in the +Z' direction, of the external frame part 12 of the crystal resonator plate 10. Alternatively, the internal wirings may be formed on all the four inner wall surfaces of the external frame part 12 of the crystal resonator plate 10 (i.e. on the inner wall surface 105 in the −X direction, the inner wall surface 106 in the +X direction, the inner wall surface in the −Z' direction, and the inner wall surface in the +Z' direction).

In the above-described embodiment, the grounding electrode is formed on the first main surface 201 of the first sealing member 20, which is a surface not facing the internal space. However, the present invention is not limited thereto. The grounding electrode may be formed on the second main surface 202 of the first sealing member 20, which is a surface facing the internal space.

In the above-described embodiment, the number of the external electrode terminals 32 on the second main surface 302 of the second sealing member 30 is four. However, the present invention is not limited thereto. The number of the external electrode terminals 32 may be, for example, two, six, or eight. Also, the present invention is applied to the crystal resonator 100. However, the present invention is not limited thereto. The present invention may be applied to a crystal oscillator or the like.

In the above-described embodiment, the first sealing member 20 and the second sealing member 30 are each made of a crystal plate. However, the present invention is not limited thereto. The first sealing member 20 and the second sealing member 30 may be made of, for example, glass or resin.

In the above-described embodiment, the side-surface wirings 171 and 172 of the crystal resonator plate 10 are disposed so as to be displaced respectively from both of: the side-surface wirings 271 and 272 of the first sealing member 20; and the side-surface wirings 371 and 372 of the second sealing member 30, in the Z' axis direction. However, the side-surface wirings 171 and 172 of the crystal resonator plate 10 are not necessarily required to be displaced respectively from the side-surface wirings 271 and 272 of the first sealing member 20 in the Z' axis direction. They may be only respectively displaced from the side-surface wirings 371 and 372 of the second sealing member 30 in the Z' axis direction.

Also in the above-described embodiment, the side-surface wirings 271 and 272 of the first sealing member 20 are disposed respectively at substantially the same position as the side-surface wirings 371 and 372 of the second sealing member 30 in side view. However, the side-surface wirings 271 and 272 of the first sealing member 20 may be respectively displaced from the side-surface wirings 371 and 372 of the second sealing member 30 in side view.

In the above-described embodiment, all of the following side-surface wirings (the side-surface wirings 171 and 172 of the crystal resonator plate 10, the side-surface wirings 271 and 272 of the first sealing member 20, and the side-surface wirings 371 and 372 of the second sealing member 30) are formed on the side surface of the package of the crystal resonator 100 in the X axis direction (i.e. on the X axis end surface). Alternatively, the above side-surface wirings (the side-surface wirings 171 and 172 of the crystal resonator plate 10, the side-surface wirings 271 and 272 of the first sealing member 20, and the side-surface wirings 371 and 372 of the second sealing member 30) may be formed on the side surface of the package of the crystal resonator 100 in the Z' axis direction (i.e. on the Z' axis end surface). However, by forming the above side-surface wirings (the side-surface wirings 171 and 172 of the crystal resonator plate 10, the side-surface wirings 271 and 272 of the first sealing member 20, and the side-surface wirings 371 and 372 of the second sealing member 30) on the side surface of the package of the crystal resonator 100 in the X axis direction (i.e. on the X axis end surface), it is possible to easily form the above side-surface wirings that are stable and not likely to generate disconnection.

In the above-described embodiment, the first and second side-surface wirings 171 and 172 formed on the crystal resonator plate 10 are disposed so as to respectively overlap the external electrode terminals 32 and 32 formed on the second main surface 302 (the surface not facing the internal space) of the second sealing member 30 in the vertical direction in side view (see FIGS. 8 and 9). However, as shown in Variation 1 shown in FIGS. 11 and 12, first and second side-surface wirings 171*a* and 172*a* may be disposed so as not to overlap the external electrode terminals 32 and 32 in the vertical direction in side view.

Figure 11:
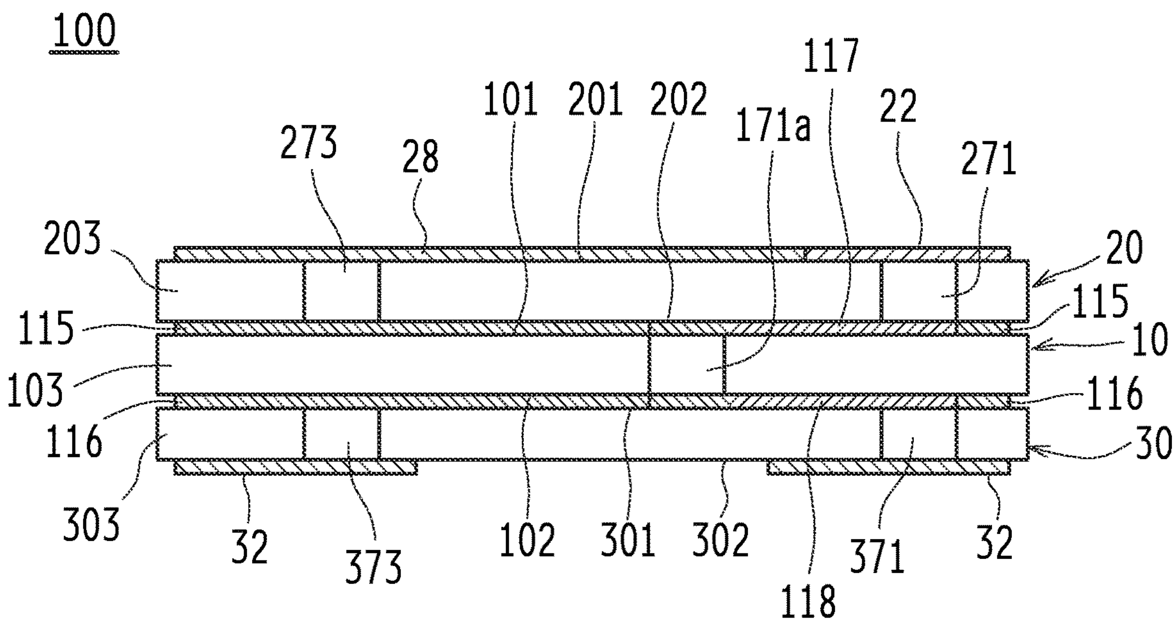
FIG. 11 is a schematic side view illustrating a crystal resonator in the −X direction according to Variation 1.
Figure 11:
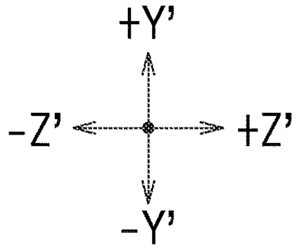

In Variation 1 as shown in FIG. 11, the first side-surface wiring 171*a* formed on the side surface 103 of the crystal resonator plate 10 in the −X direction is disposed so as to be further displaced in the −Z' direction compared to the first side-surface wiring 171 shown in FIG. 8. Specifically, the first side-surface wiring 171*a* is disposed, in side view, in the space between the two external electrode terminals 32 and 32. In this way, the first side-surface wiring 171*a* is disposed so as not to overlap the external electrode terminals 32 and 32 in the vertical direction in side view.

Figure 12:
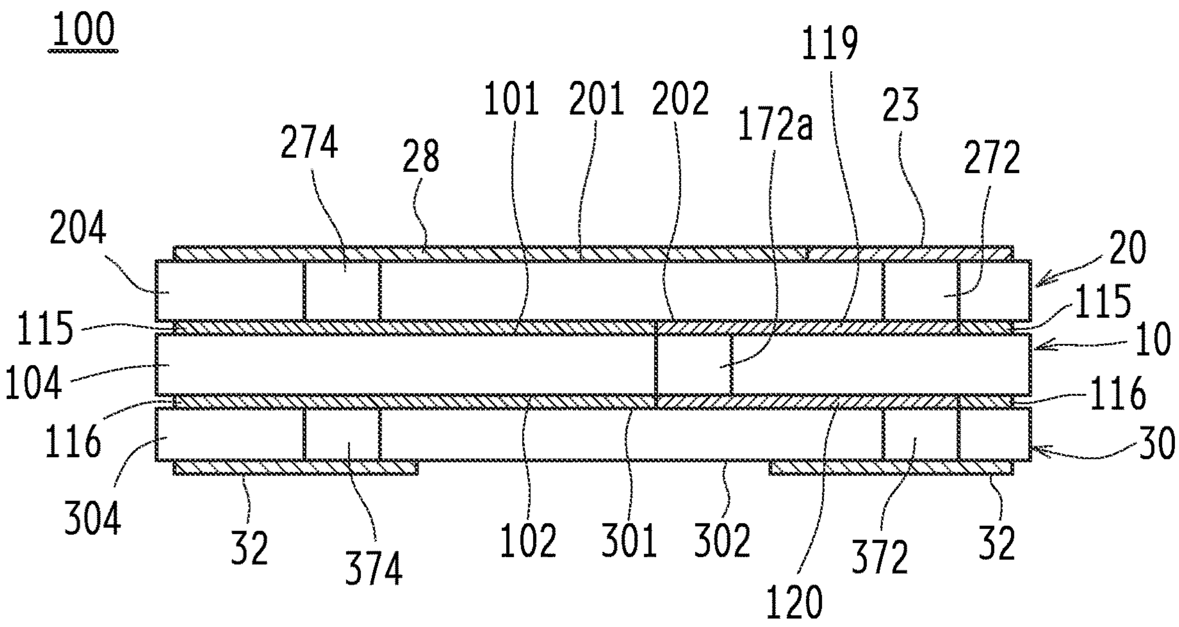
FIG. 12 is a schematic side view illustrating the crystal resonator in the +X direction according to Variation 1.
Figure 12:
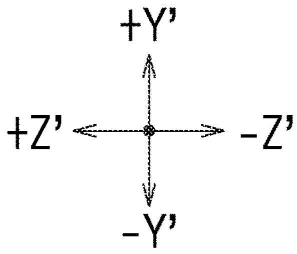

Also as shown in FIG. 12, the second side-surface wiring 172*a* formed on the side surface 104 of the crystal resonator plate 10 in the +X direction is disposed so as to be further displaced in the +Z' direction compared to the second side-surface wiring 172 shown in FIG. 9. Specifically, the second side-surface wiring 172*a* is disposed, in side view, in the space between the two external electrode terminals 32 and 32. In this way, the second side-surface wiring 172*a* is disposed so as not to overlap the external electrode terminals 32 and 32 in the vertical direction in side view.

In Variation 1, since the first and second side-surface wirings 171*a* and 172*a* formed on the crystal resonator plate 10 do not overlap respectively the external electrode terminals 32 and 32 formed on the second sealing member 30 in the vertical direction in side view, it is possible to prevent the solder protruding from the external electrode terminals 32 and 32 from making contact with and adhering to the first and second side-surface wirings 171*a* and 172*a*. Thus, it is possible to prevent increase of the conduction resistance and/or generation of disconnection due to the solder adhesion to the first and second side-surface wirings 171*a* and 172*a*.

The above-described erosion resistance structure is described as an example, and accordingly may be modified in various manners. For example, in addition to the removal of the whole or part of the Au film from the seventh and eighth side-surface wirings 371 and 372 of the second sealing member 30, part of the Au film 32*c* may be removed from the end part of the external electrode terminal 32 of the second sealing member 30. Also, part of the Au film 381*c* may be removed from the end part of the interlayer wiring bonding pattern 381 of the second sealing member 30.

In the above-described embodiment, the whole or part of the Au film is removed from the seventh and eighth side-surface wirings 371 and 372 of the second sealing member 30. However, the present invention is not limited thereto. The erosion resistance structure may be realized by forming another metal film (other than the Au film) having a low wettability against the solder (for example, Ti) on the Au film maintained on the seventh and eighth side-surface wirings 371 and 372 of the second sealing member 30. That is, the surface of the Au film of each of the seventh and eighth side-surface wirings 371 and 372 of the second sealing member 30 is covered by the metal film made of a metal other than Au. In this case, it is possible to prevent the solder from wetting and spreading along the Au film on the seventh and eighth side-surface wirings 371 and 372 of the second sealing member 30. Thus, it is possible to prevent increase of the conduction resistance and/or generation of disconnection. However, from the viewpoint of further reliable reduction of wetting and spreading of the solder, it is preferable that the Au film on the seventh and eighth side-surface wirings 371 and 372 of the second sealing member 30 is removed as in the above-described embodiment in order to block the solder erosion path.

In the above-described embodiment, in addition to the removal of the whole or part of the Au film from the seventh and eighth side-surface wirings 371 and 372 of the second sealing member 30, part of the Au film 32*c* may be removed from the external electrode terminal 32 of the second sealing member 30. Also, part of the Au film 381*c* may be removed from the interlayer wiring bonding pattern 381 of the second sealing member 30.

It is preferable that the above-described erosion resistance structure is provided on at least the seventh and eighth side-surface wirings 371 and 372 of the second sealing member 30. Thus, in addition to the seventh and eighth side-surface wirings 371 and 372 of the second sealing member 30, the similar erosion resistance structure may be provided on the third and fourth side-surface wirings 271 and 272 of the first sealing member 20. This structure is further preferable because the solder erosion path can be blocked not only on the seventh and eighth side-surface wirings 371 and 372 of the second sealing member 30 but also on the third and fourth side-surface wirings 271 and 272 of the first sealing member 20.

In the above-described embodiment, the metal film 28 is provided as a grounding electrode on the first main surface (a main surface not facing the internal space) 201 of the first sealing member 20. The metal film 28 is electrically connected to the external electrode terminal 32 formed on the second main surface (a main surface not facing the internal space) 302 of the second sealing member 30 via the first and second internal wirings 173 and 174 formed on the inner wall surfaces 105 and 106 of the external frame part 12 of the crystal resonator plate 10. However, as exemplarily shown in FIGS. 13 to 19 as Variation 2, a metal film 29 may be provided as a grounding electrode on the second main surface (a main surface facing the internal space) 202 of the first sealing member 20. With this crystal resonator 100 according to Variation 2, it is also possible to obtain an effect similar to that in the above-described embodiment. Hereinafter, a description will be given on the crystal resonator 100 according to Variation 2, mainly on differences from the above-described embodiment.

Figure 13:
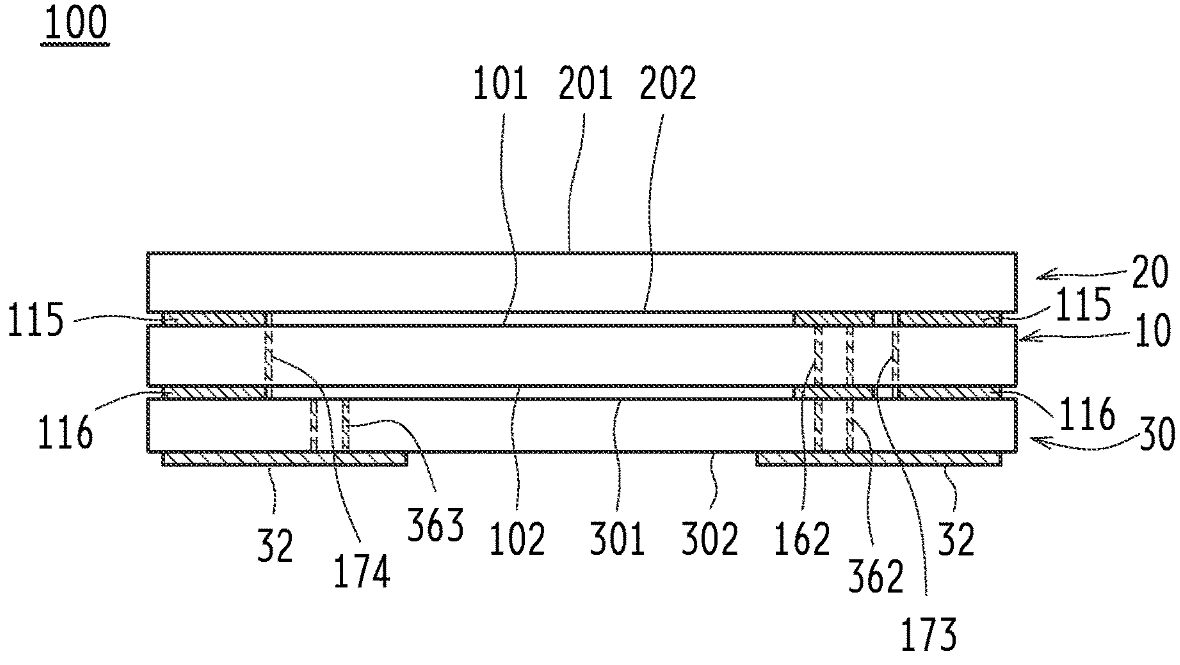
FIG. 13 is a schematic side view illustrating a crystal resonator according to Variation 2, which corresponds to FIG. 1.

As shown in FIG. 13, the crystal resonator 100 includes: the crystal resonator plate (piezoelectric resonator plate) 10; the first sealing member 20; and the second sealing member 30. In this crystal resonator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. That is, in the crystal resonator 100, the first sealing member 20 and the second sealing member 30 are bonded to respective main surfaces of the crystal resonator plate 10, thus an internal space (cavity) of the package is formed. In this internal space, the vibrating part 11 (see FIGS. 15 and 16) is hermetically sealed. In the same way as the above-described embodiment, an AT-cut crystal plate is used for each of the crystal resonator plate 10, the first sealing member 20, and the second sealing member 30.

Figure 14:
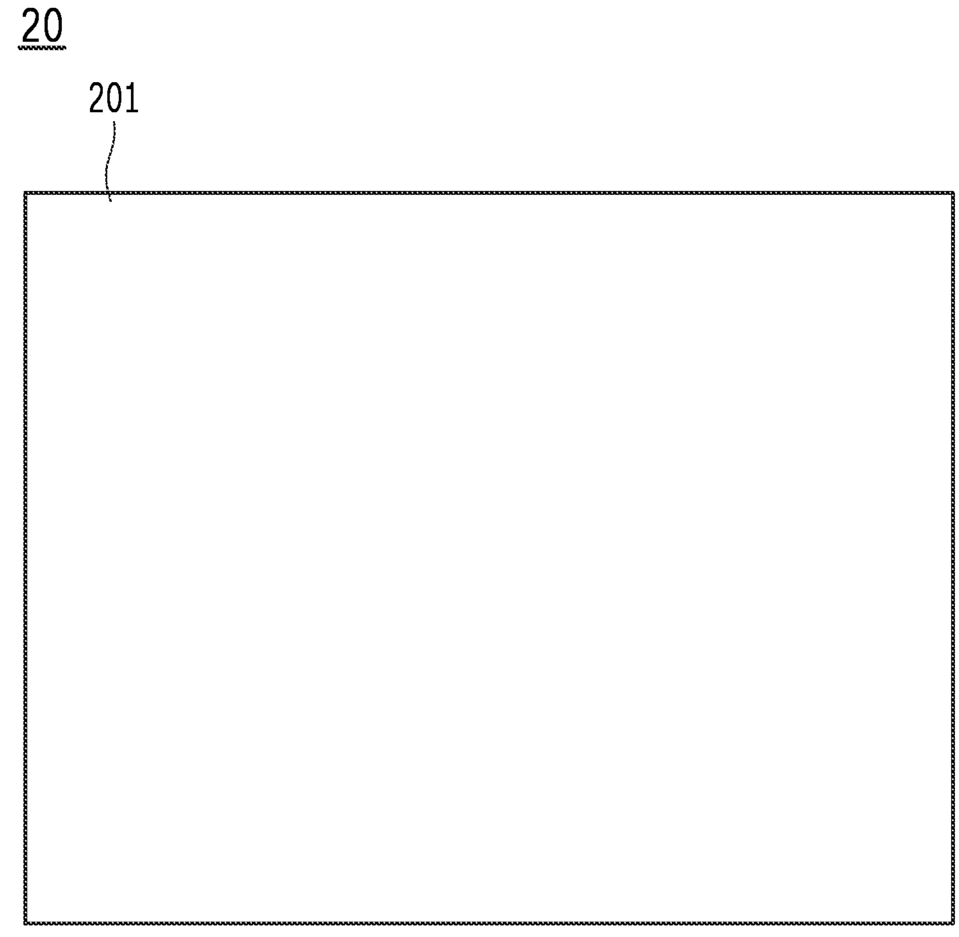
FIG. 14 is a schematic plan view illustrating a first sealing member of the crystal resonator according to Variation 2, which corresponds to FIG. 2.
Figure 14:
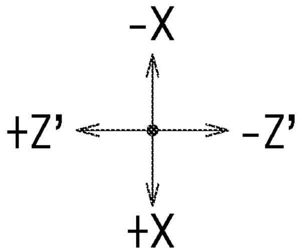
Figure 15:
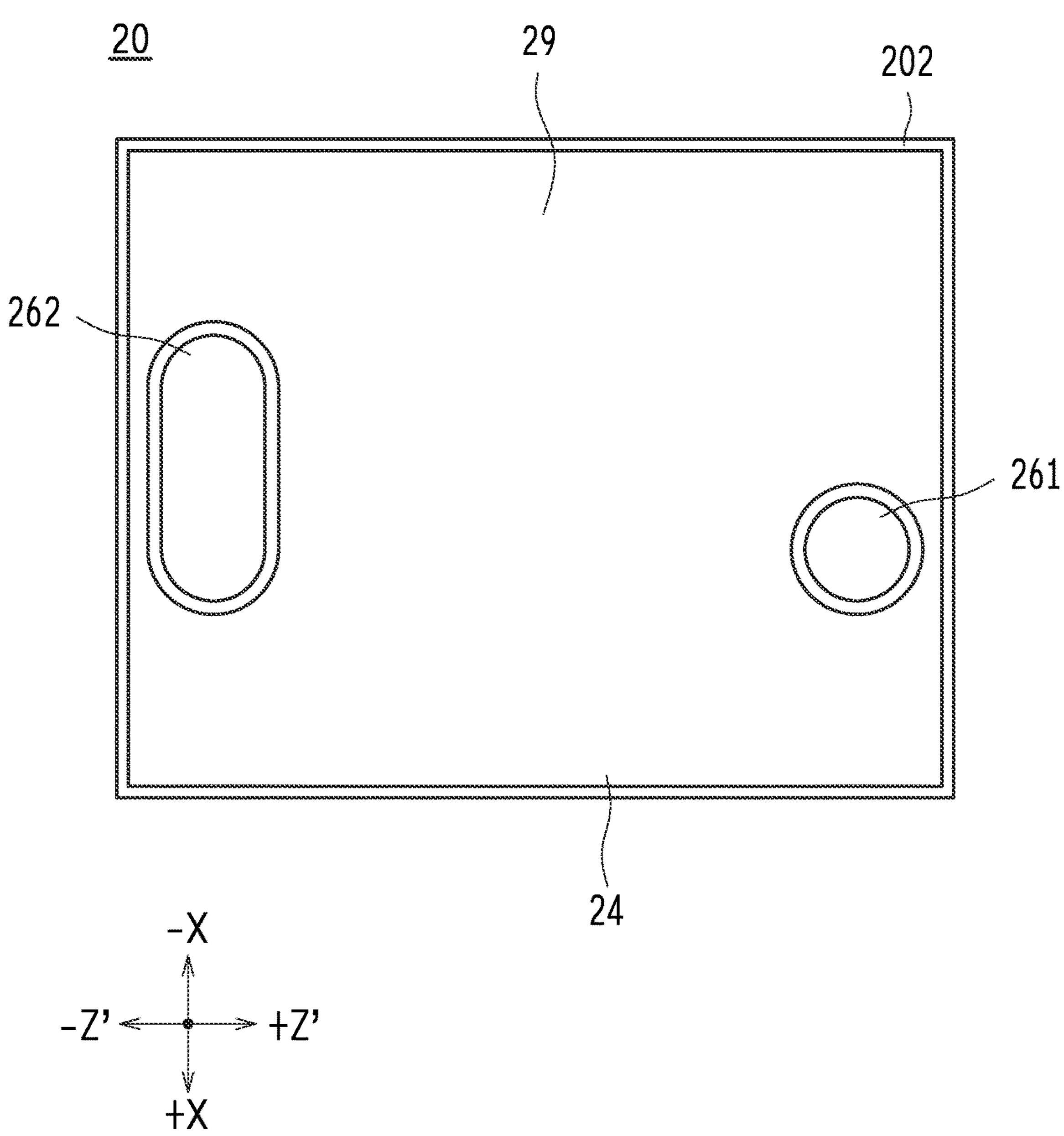
FIG. 15 is a schematic plan view illustrating the first sealing member of the crystal resonator according to Variation 2, which corresponds to FIG. 3.

Unlike the above-described embodiment, no metal film is formed on the first main surface 201 (a main surface not facing the internal space) of the first sealing member 20, as shown in FIGS. 14 and 15. Also unlike the above-described embodiment, no side-surface wiring is formed on the side surface of the first sealing member 20. Also unlike the above-described embodiment, no through hole is formed in first sealing member 20.

On the other hand, the metal film 29 for shielding (for ground connection) is formed on the second main surface 202 (a main surface facing the internal space) of the first sealing member 20. The metal film 29 is formed integrally with the annular sealing-member-side first bonding pattern 24 to be bonded to the crystal resonator plate 10. Also, a circular connection bonding pattern 261 and an elongated circular connection bonding pattern 262 are formed on the second main surface 202 of the first sealing member 20. The metal film 29 and the sealing-member-side first bonding pattern 24 are provided over almost the entire area of the second main surface 202 of the first sealing member 20, except for the area where the connection bonding patterns 261 and 262 are provided.

Figure 16:
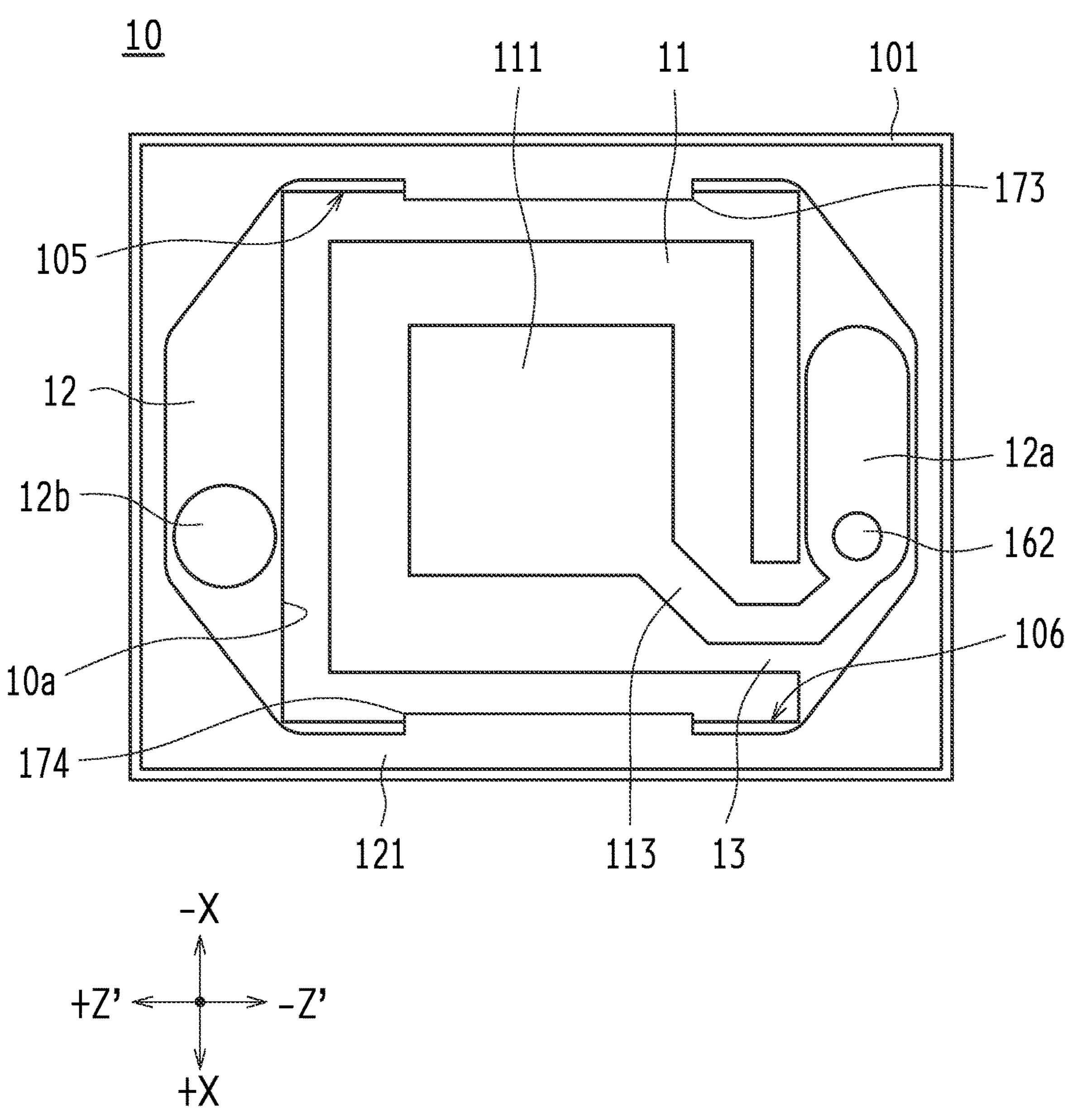
FIG. 16 is a schematic plan view illustrating a crystal resonator plate of the crystal resonator according to Variation 2, which corresponds to FIG. 4.
Figure 17:
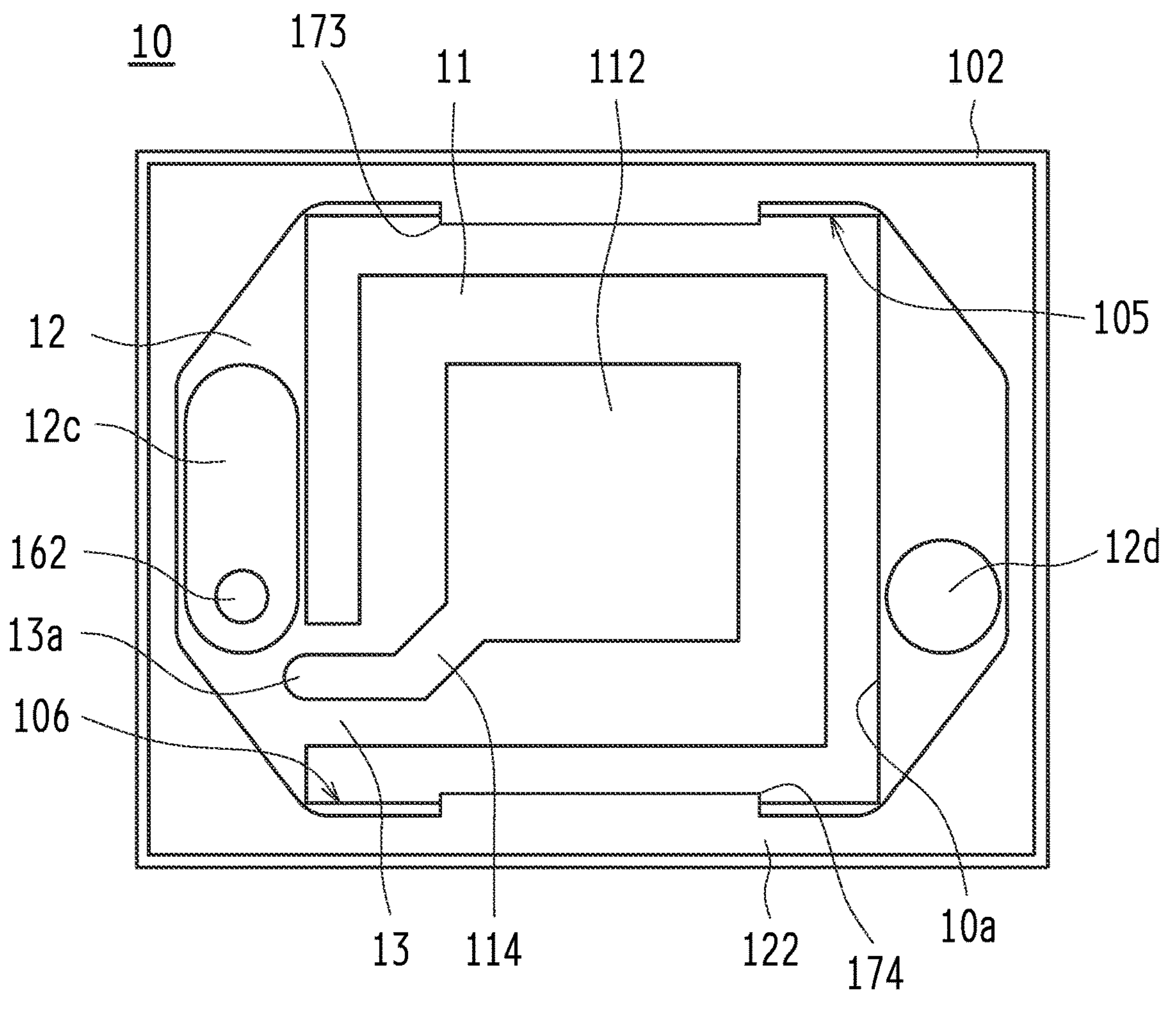
FIG. 17 is a schematic plan view illustrating the crystal resonator plate of the crystal resonator according to Variation 2, which corresponds to FIG. 5.

Similarly to the above-described embodiment, the crystal resonator plate 10 includes: the vibrating part 11 formed so as to have a substantially rectangular shape; the external frame part 12 surrounding the outer periphery of the vibrating part 11; and the support part 13 that supports the vibrating part 11 by connecting the vibrating part 11 to the external frame part 12, as shown in FIGS. 16 and 17. Also, the cutout part 10*a* is provided between the vibrating part 11 and the external frame part 12 by cutting out the crystal resonator plate 10. In this embodiment, the crystal resonator plate 10 has only one support part 13 to connect the vibrating part 11 to the external frame part 12. The cutout part 10*a* is continuously formed so as to surround the outer periphery of the vibrating part 11.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to the lead-out wirings (the first lead-out wiring 113 and the second lead-out wiring 114) so that these excitation electrodes are connected to external electrode terminals. The first lead-out wiring 113 is drawn from the first excitation electrode 111 and connected to an elongated circular connection bonding pattern 12*a* formed on the external frame part 12 via the support part 13. The second lead-out wiring 114 is drawn from the second excitation electrode 112 and connected to a connection bonding pattern 13*a* formed on the support part 13.

On the first main surface 101 of the crystal resonator plate 10, the resonator-plate-side first bonding pattern 121 is formed. On the second main surface 102 of the crystal resonator plate 10, the resonator-plate-side second bonding pattern 122 is formed. The resonator-plate-side first bonding pattern 121 and the resonator-plate-side second bonding pattern 122 are each formed on the external frame part 12 so as to have an annular shape in plan view. Also on the first main surface 101, an annular connection bonding pattern 12*b* is formed. The connection bonding patterns 12*a* and 12*b* are provided on the inner peripheral side of the resonator-plate-side first bonding pattern 121. On the second main surface 102, an elongated circular connection bonding pattern 12*c* and a circular connection bonding pattern 12*d* are formed. The connection bonding patterns 12*c* and 12*d* are provided on the inner peripheral side of the resonator-plate-side second bonding pattern 122. The connection bonding pattern 12*c* is not connected to the connection bonding pattern 13*a* drawn from the second excitation electrode 112, but is disposed at a predetermined distance from the connection bonding pattern 13*a*.

Unlike the above-described embodiment, no side-surface wiring is formed on the side surface of the crystal resonator plate 10. On the other hand, one first through hole 162 is formed in the crystal resonator plate 10 so as to penetrate between the first main surface 101 and the second main surface 102. More specifically, the first through hole 162 is disposed in the external frame part 12, on the inner peripheral side of the resonator-plate-side first bonding pattern 121 and the resonator-plate-side second bonding pattern 122. On the periphery of the first through hole 162, the connection bonding pattern 12*a* is formed on the first main surface 101 side while the connection bonding pattern 12*c* is formed on the second main surface 102 side. In the first through hole 162, a through electrode is formed along the inner wall surface of the first through hole 162 so as to establish conduction between the electrodes formed on the first main surface 101 and the second main surface 102.

Similarly to the above-described embodiment, two internal wirings are formed on the inner wall surface of the external frame part 12 of the crystal resonator plate 10. Specifically, the first internal wiring 173 is formed on the inner wall surface 105 of the external frame part 12 of the crystal resonator plate 10 in the −X direction. The second internal wiring 174 is formed on the inner wall surface 106 of the external frame part 12 of the crystal resonator plate 10 in the +X direction.

The first internal wiring 173 is provided on a center part of the inner wall surface 105 of the external frame part 12 in the −X direction such that the first internal wiring 173 has a predetermined width. The first internal wiring 173 is disposed along the Z' axis direction. The first internal wiring 173 is connected to the resonator-plate-side first bonding pattern 121 provided on the first main surface 101 of the crystal resonator plate 10. The first internal wiring 173 is also connected to the resonator-plate-side second bonding pattern 122 provided on the second main surface 102 of the crystal resonator plate 10. The first internal wiring 173 may be provided along the entire area of the inner wall surface 105 of the external frame part 12 in the −X direction. Also, the first internal wiring 173 may be continuously provided from the inner wall surface 105 in the −X direction to the inner wall surface in the Z' axis direction of the external frame part 12. In this case, the first internal wiring 173 may be continuously provided along only one of the inner wall surfaces of the external frame part 12 in the +Z' direction and in the −Z' direction. Alternatively, the first internal wiring 173 may be continuously provided along both of the inner wall surfaces of the external frame part 12 in the +Z' direction and in the −Z' direction.

The second internal wiring 174 is provided on a center part of the inner wall surface 106 of the external frame part 12 in the +X direction such that the second internal wiring 174 has a predetermined width. The second internal wiring 174 is disposed along the Z' axis direction. The second internal wiring 174 is connected to the resonator-plate-side first bonding pattern 121 provided on the first main surface 101 of the crystal resonator plate 10. The second internal wiring 174 is also connected to the resonator-plate-side second bonding pattern 122 provided on the second main surface 102 of the crystal resonator plate 10. The first internal wiring 173 and the second internal wiring 174 are disposed so as to face each other with the vibrating part 11 being interposed therebetween. The second internal wiring 174 may be provided along the entire area of the inner wall surface 106 of the external frame part 12 in the +X direction. Also, the second internal wiring 174 may be continuously provided from the inner wall surface 106 in the +X direction to the inner wall surface in the Z' axis direction of the external frame part 12. In this case, the second internal wiring 174 may be continuously provided along only one of the inner wall surfaces of the external frame part 12 in the +Z' direction and in the −Z' direction. Alternatively, the second internal wiring 174 may be continuously provided along both of the inner wall surfaces of the external frame part 12 in the +Z' direction and in the −Z' direction.

Also, the first internal wiring 173 and the second internal wiring 174 may be integrally provided by continuously forming the first internal wiring 173 and the second internal wiring 174 along the inner wall surfaces of the external frame part 12 in the Z' axis direction. Furthermore, the first internal wiring 173 and the second internal wiring 174 may be provided so as to be along the entire periphery of the inner wall surface of the external frame part 12.

Figure 18:
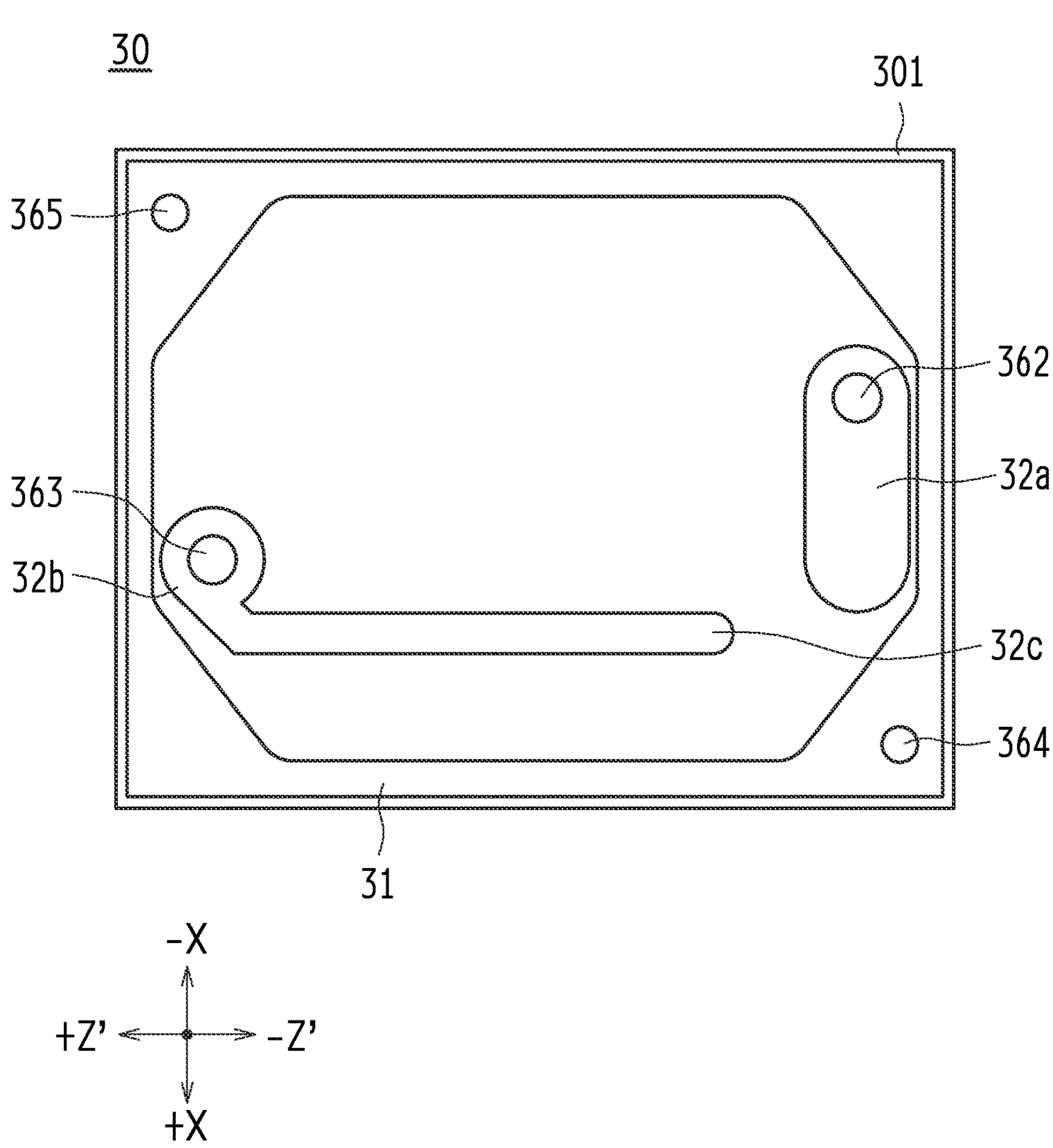
FIG. 18 is a schematic plan view illustrating a second sealing member of the crystal resonator according to Variation 2, which corresponds to FIG. 6.
Figure 19:
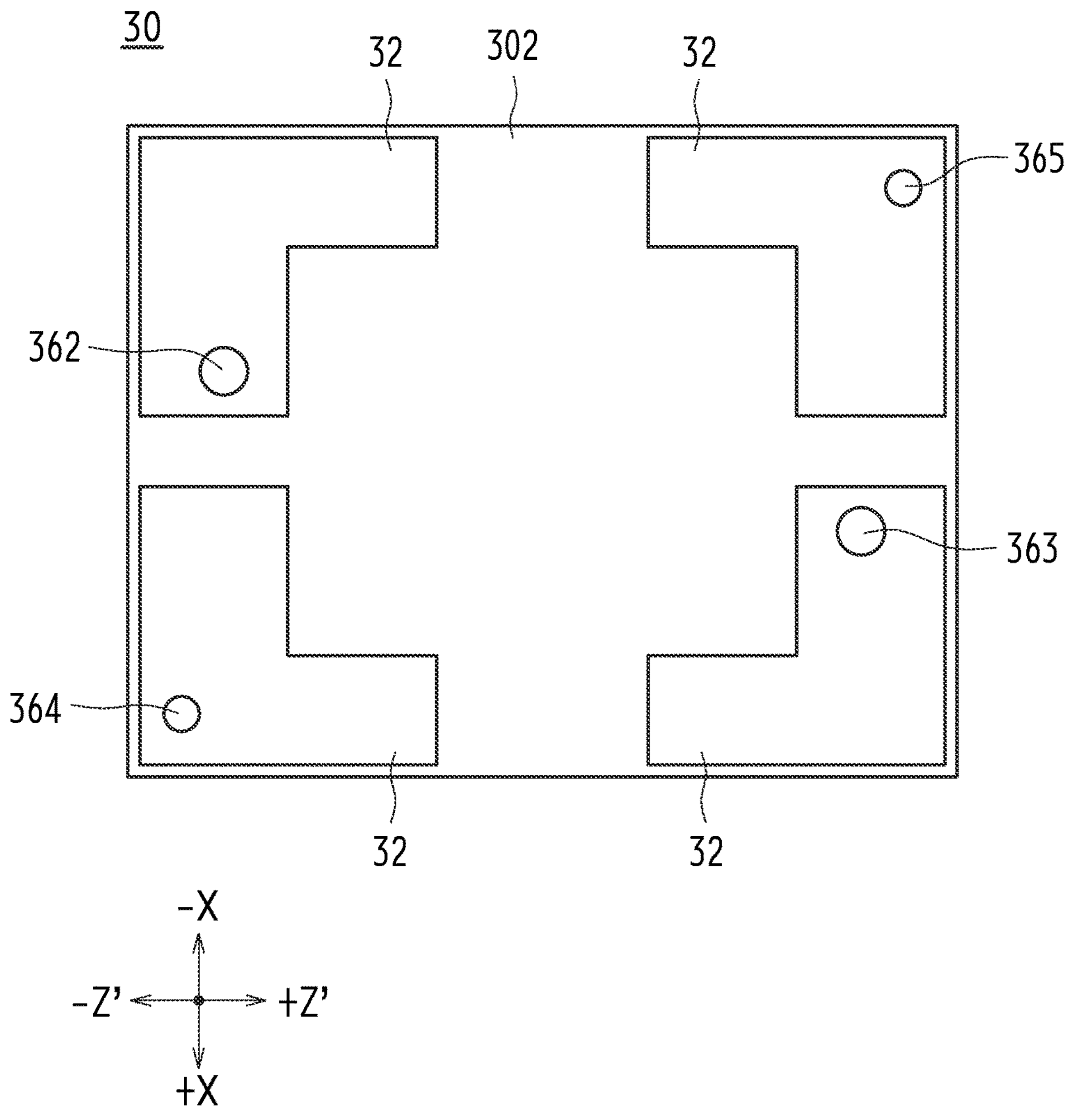
FIG. 19 is a schematic plan view illustrating the second sealing member of the crystal resonator according to Variation 2, which corresponds to FIG. 7.

As shown in FIGS. 18 and 19, on the first main surface 301 of the second sealing member 30, the sealing-member-side second bonding pattern 31 is formed so as to be bonded to the crystal resonator plate 10. The sealing-member-side second bonding pattern 31 is formed so as to have an annular shape in plan view. Also on the first main surface 301 are formed an elongated circular connection bonding pattern 32*a*, a circular connection bonding pattern 32*b*, and a connection bonding pattern 32*c* that is integrally formed with the connection bonding pattern 32*b*. The connection bonding pattern 32*c* extends in the Z' axis direction. The connection bonding patterns 32*a* to 32*c* are provided on the inner peripheral side of the sealing-member-side second bonding pattern 31.

On the second main surface 302 of the second sealing member 30, four external electrode terminals 32 are formed, which are electrically connected to an external circuit board provided outside the crystal resonator 100. The external electrode terminals 32 are respectively located on the four corners (corner parts) on the second main surface 302 of the second sealing member 30. The external electrode terminals 32 are respectively disposed along the internal space of the package of the crystal resonator 100 in plan view, and each have a substantially L-shape. The external electrode terminals 32 are also disposed so as to be superimposed on the external frame part 12 of the crystal resonator plate 10 in plan view.

Unlike the above-described embodiment, no side-surface wiring is formed on the side surface of the second sealing member 30. On the other hand, four second to fifth through holes 362 to 365 are formed in the second sealing member 30 so as to penetrate between the first main surface 301 and the second main surface 302. The second and third through holes 362 and 363 are provided on the inner peripheral side of the sealing-member-side second bonding pattern 31. On the periphery of the second through hole 362, the connection bonding pattern 32*a* is formed on the first main surface 301 side while the external electrode terminal 32 is formed on the second main surface 302 side. On the periphery of the third through hole 363, the connection bonding pattern 32*b* is formed on the first main surface 301 side while the external electrode terminal 32 is formed on the second main surface 302 side. On the respective peripheries of the fourth and fifth through holes 364 and 365, the sealing-member-side second bonding pattern 31 is formed on the first main surface 301 side while the external electrode terminals 32 are respectively formed on the second main surface 302 side. In each of the second to fifth through holes 362 to 365, a through electrode is formed along the corresponding inner wall surface of the second to fifth through holes 362 to 365 so as to establish conduction between the electrodes formed on the first main surface 301 and the second main surface 302.

In the crystal resonator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 13 is produced. Accordingly, the internal space of the package, i.e. the space to house the vibrating part 11 is hermetically sealed.

In the crystal resonator 100, sealing parts (seal paths) 115 and 116 that hermetically seal the vibrating part 11 of the crystal resonator plate 10 are formed so as to have an annular shape in plan view. The seal path 115 is formed by the diffusion bonding (Au—Au bonding) of the resonator-plate-side first bonding pattern 121 and the sealing-member-side first bonding pattern 24 as described above. The outer edge of the seal path 115 has a substantially rectangular shape, and the outer peripheral edge of the seal path 115 is disposed so as to be adjacent to the outer peripheral edge of the package. In the same way, the seal path 116 is formed by the diffusion bonding (Au—Au bonding) of the resonator-plate-side second bonding pattern 122 and the sealing-member-side second bonding pattern 31 as described above. The outer edge of the seal path 116 has a substantially rectangular shape, and the outer peripheral edge of the seal path 116 is disposed so as to be adjacent to the outer peripheral edge of the package.

The respective connection bonding patterns as described above are also subjected to the diffusion bonding in a state in which they are each superimposed on the corresponding connection bonding pattern. Such kinds of bonding between the connection bonding patterns allow electrical conduction between the first excitation electrode 111 and the second excitation electrode 112, and the external electrode terminals 32 of the crystal resonator 100. More specifically, the first excitation electrode 111 is connected to the external electrode terminal 32 via the first lead-out wiring 113, the first through hole 162, and the second through hole 362 in this order. The second excitation electrode 112 is connected to the external electrode terminal 32 via the second lead-out wiring 114, the connection bonding pattern 32*c*, and the third through hole 363 in this order. Furthermore, the metal film 29 that is integrally formed with the seal path 115 is earth-connected (ground connection using parts of the external electrode terminals 32) via the first and second internal wirings 173 and 174, the seal path 116, and the fourth and fifth through holes 364 and 365 in this order.

In Variation 2 as described above, the respective electrical conduction paths between the first excitation electrode 111 and the external electrode terminal 32 and between the second excitation electrode 112 and the external electrode terminal 32 are not electrically connected to the annular seal paths 115 and 116. Also, unlike the above-described embodiment, the respective electrical conduction paths between the first excitation electrode 111 and the external electrode terminal 32 and between the second excitation electrode 112 and the external electrode terminal 32 are formed without using the side-surface wirings. Furthermore, unlike the above-described embodiment, the respective electrical conduction paths between the first excitation electrode 111 and the external electrode terminal 32 and between the second excitation electrode 112 and the external electrode terminal 32 do not pass through the first main surface (a main surface not facing the internal space) 201 of the first sealing member 20.

Also in Variation 2 as described above, the metal film 29 as a grounding electrode is provided on the second main surface (a main surface facing the internal space) 202 of the first sealing member 20. The metal film 29 is electrically connected to the external electrode terminal 32 formed on the second main surface (a main surface not facing the internal space) 302 of the second sealing member 30 via respectively the first and second internal wirings 173 and 174 formed on the inner wall surfaces 105 and 106 of the external frame part 12 of the crystal resonator plate 10. Thus, since the metal film 29 as a grounding electrode is formed on the second main surface 202 of the first sealing member 20 while the internal wirings 173 and 174 for ground connection are provided on the inner wall surfaces 105 and 106 of the external frame part 12 of the crystal resonator plate 10, it is possible to prevent the influence of the external environment, which leads to stable ground connection.

Also, since the first and second internal wirings 173 and 174 are provided in the Z' axis direction, it is possible to prevent the disconnection of the first and second internal wirings 173 and 174 due to anisotropy of the AT-cut crystal plate when processing the crystal resonator plate 10 by wet etching.

This application claims priority based on Patent Application No. 2020-208448 filed in Japan on Dec. 16, 2020. The entire contents thereof are hereby incorporated in this application by reference.

DESCRIPTION OF THE REFERENCE NUMERALS

10 Crystal resonator plate (piezoelectric resonator plate)
10*a* Cutout part
11 Vibrating part
12 External frame part
13 Support part
20 First sealing member
28 Metal film (grounding electrode)
30 Second sealing member
32 External electrode terminal
100 Crystal resonator (piezoelectric resonator device)
105, 106 Inner wall surface
111 First excitation electrode
112 Second excitation electrode
173 First internal wiring
174 Second internal wiring
201 First main surface (main surface not facing internal space)
202 Second main surface (main surface facing internal space)
302 Second main surface (main surface not facing internal space)

The invention claimed is:

1. A piezoelectric resonator device, comprising:

a piezoelectric resonator plate including a first excitation electrode formed on a first main surface of a substrate, and a second excitation electrode formed on a second main surface of the substrate, the second excitation electrode making a pair with the first excitation electrode;

a first sealing member covering the first excitation electrode of the piezoelectric resonator plate;

a second sealing member covering the second excitation electrode of the piezoelectric resonator plate; and an internal space formed by bonding the first sealing member to the piezoelectric resonator plate and furthermore bonding the second sealing member to the piezoelectric resonator plate, the internal space hermetically sealing a vibrating part including the first excitation electrode and the second excitation electrode of the piezoelectric resonator plate, wherein the piezoelectric resonator plate includes: the vibrating part; an external frame part surrounding an outer periphery of the vibrating part; a support part connecting the vibrating part and the external frame part; and a cutout part formed by cutting out the piezoelectric resonator plate between the vibrating part and the external frame part, and a grounding electrode formed on a main surface of the first sealing member is electrically connected to an external electrode terminal formed on a main surface, which does not face the internal space, of the second sealing member via an internal wiring formed on an inner wall surface of the external frame part of the piezoelectric resonator plate.

2. The piezoelectric resonator device according to claim 1, wherein a sealing part having an annular shape and sealing hermetically the vibrating part of the piezoelectric resonator plate is each formed between the first sealing member and the piezoelectric resonator plate and between the second sealing member and the piezoelectric resonator plate, and the sealing part is electrically connected to the internal wiring.

3. The piezoelectric resonator device according to claim 1, wherein the internal wiring is formed so as to extend along the inner wall surface of the external frame part.

4. The piezoelectric resonator device according to claim 3, wherein the internal wiring is each provided on a pair of inner wall surfaces of the external frame part, and the pair of inner wall surfaces faces each other in plan view.

5. The piezoelectric resonator device according to claim 3, wherein a width of the internal wiring is larger than respective widths of the first excitation electrode and the second excitation electrode in a direction in which the internal wiring extends.

6. The piezoelectric resonator device according to claim 1, wherein the grounding electrode is formed on the main surface of the first sealing member, and the main surface does not face the internal space, the grounding electrode is electrically connected to an external wiring formed on an outer side surface of the first sealing member, and the external electrode terminal on the second sealing member is electrically connected to an external wiring formed on an outer side surface of the second sealing member.

7. The piezoelectric resonator device according to claim 1, wherein an external wiring is formed on an outer side surface of the piezoelectric resonator plate so as to be electrically connected to one excitation electrode out of the first excitation electrode and the second excitation electrode, and the internal wiring is disposed between the external wiring and the one excitation electrode.

8. The piezoelectric resonator device according to claim 1, wherein the grounding electrode is formed on the main surface of the first sealing member, and the main surface faces the internal space, and the grounding electrode is electrically connected to the internal wiring formed on the inner wall surface of the external frame part of the piezoelectric resonator plate.

9. The piezoelectric resonator device according to claim 1, wherein the piezoelectric resonator plate is an AT-cut crystal plate, and the internal wiring is formed along a Z' axis direction of the AT-cut crystal plate.

* * * * *